(12) United States Patent
Kim et al.

(10) Patent No.: US 12,376,229 B2
(45) Date of Patent: Jul. 29, 2025

(54) RESIN COATED COPPER AND CIRCUIT BOARD INCLUDING THE SAME

(71) Applicant: LG INNOTEK CO., LTD., Seoul (KR)

(72) Inventors: Jeong Han Kim, Seoul (KR); Yong Suk Kim, Seoul (KR); Moo Seong Kim, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 96 days.

(21) Appl. No.: 18/010,921

(22) PCT Filed: Jun. 17, 2021

(86) PCT No.: PCT/KR2021/007604
§ 371 (c)(1),
(2) Date: Dec. 16, 2022

(87) PCT Pub. No.: WO2021/256870
PCT Pub. Date: Dec. 23, 2021

(65) Prior Publication Data
US 2023/0240008 A1 Jul. 27, 2023

(30) Foreign Application Priority Data
Jun. 17, 2020 (KR) .......... 10-2020-0073573

(51) Int. Cl.
*H05K 1/09* (2006.01)
*B32B 3/02* (2006.01)
(Continued)

(52) U.S. Cl.
CPC ............... *H05K 1/056* (2013.01); *B32B 3/02* (2013.01); *B32B 3/30* (2013.01); *B32B 7/02* (2013.01);
(Continued)

(58) Field of Classification Search
CPC .......... H05K 1/092; H05K 1/097; H05K 1/09; H05K 1/095; H05K 3/107
See application file for complete search history.

(56) References Cited

U.S. PATENT DOCUMENTS 6,569,756 B1    5/2003  Sugai
8,756,803 B2    6/2014  Nakai et al.
(Continued)

FOREIGN PATENT DOCUMENTS

JP    2000-049162    2/2000
JP    2012-069924    4/2012
(Continued)

OTHER PUBLICATIONS

International Search Report dated Oct. 12, 2021 issued in Application No. PCT/KR2021/007604.
(Continued)

*Primary Examiner* — Jeremy C Norris
(74) *Attorney, Agent, or Firm* — KED & ASSOCIATES, LLP

(57) ABSTRACT

A resin coated copper according to an embodiment includes: an insulating layer including a resin and a filler dispersed in the resin; and a copper foil layer disposed on the insulating layer, wherein the insulating layer has a plurality of pores formed on a surface in contact with the copper foil layer, and the plurality of pores have a width of 200 nm to 350 nm.

16 Claims, 12 Drawing Sheets

(51) Int. Cl.
  *B32B 3/30* (2006.01)
  *B32B 7/02* (2019.01)
  *B32B 15/04* (2006.01)
  *B32B 15/14* (2006.01)
  *B32B 15/20* (2006.01)
  *B32B 27/20* (2006.01)
  *H05K 1/05* (2006.01)

(52) U.S. Cl.
  CPC ............ *B32B 15/043* (2013.01); *B32B 15/14* (2013.01); *B32B 15/20* (2013.01); *B32B 27/20* (2013.01); *H05K 1/09* (2013.01); *B32B 2255/06* (2013.01); *B32B 2255/205* (2013.01); *B32B 2255/26* (2013.01); *B32B 2260/021* (2013.01); *B32B 2260/046* (2013.01); *B32B 2264/1055* (2020.08); *B32B 2264/302* (2020.08); *B32B 2307/204* (2013.01); *B32B 2307/30* (2013.01); *B32B 2307/538* (2013.01); *B32B 2457/08* (2013.01)

(56) References Cited

U.S. PATENT DOCUMENTS

| | | |
|---|---|---|
| 9,028,972 B2 | 5/2015 | Kohiki et al. |
| 2006/0084253 A1 | 4/2006 | Mizukoshi et al. |
| 2012/0067632 A1 | 3/2012 | Nakai et al. |
| 2013/0220685 A1 | 8/2013 | Kohiki et al. |
| 2014/0127483 A1 | 5/2014 | Moon et al. |
| 2015/0060115 A1 | 3/2015 | Lee et al. |
| 2015/0230335 A1 | 8/2015 | Lee et al. |
| 2022/0192029 A1* | 6/2022 | Shimizu .................. C23C 18/38 |

FOREIGN PATENT DOCUMENTS

| | | |
|---|---|---|
| JP | 2015-061026 | 3/2015 |
| JP | 2015-061939 | 4/2015 |
| JP | 2016-135903 | 7/2016 |
| KR | 10-2008-0037404 | 4/2008 |
| KR | 10-2012-0012732 | 2/2012 |
| KR | 10-2013-0054405 | 5/2013 |
| KR | 10-2014-0059542 | 5/2014 |
| KR | 10-2015-0025245 | 3/2015 |
| KR | 10-2015-0094076 | 8/2015 |
| WO | WO 2011/018968 | 2/2011 |
| WO | WO 2016/104748 | 6/2016 |

OTHER PUBLICATIONS

Korean Office Action dated May 22, 2025 issued in Application No. 10-2020-0073573.

Japanese Office Action dated May 27, 2025 issued in Application No. 2022-578695.

\* cited by examiner

[FIG. 1]
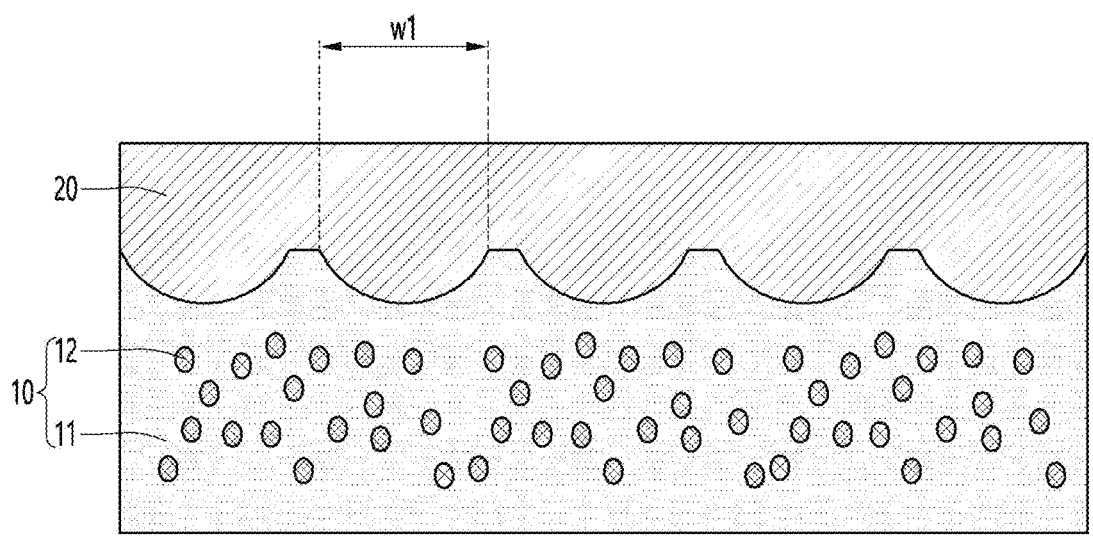

[FIG. 2]
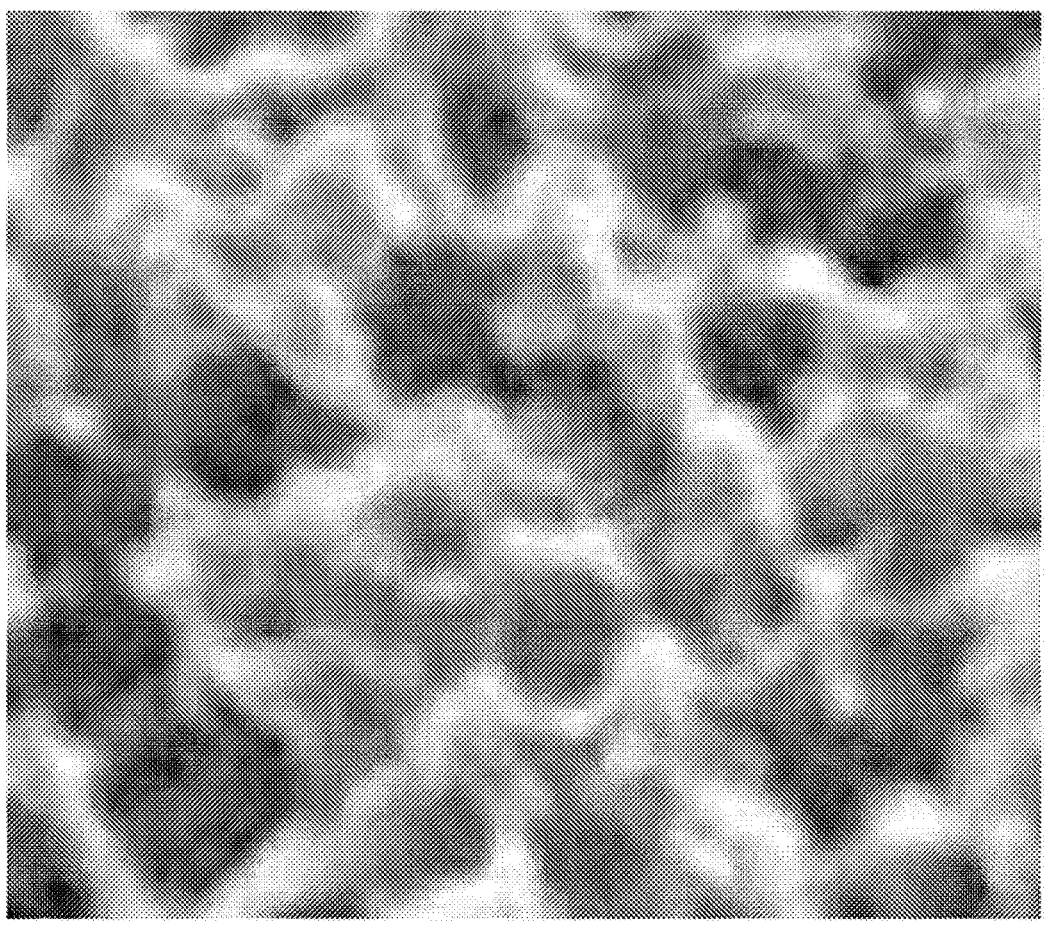

[FIG. 3]
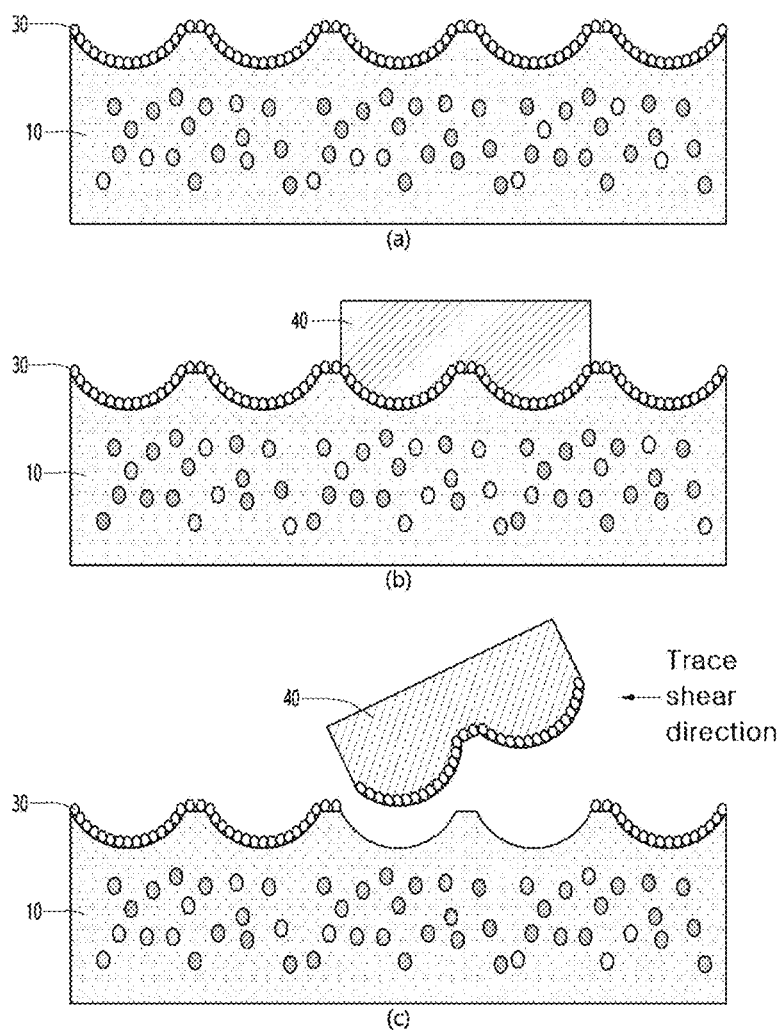

[FIG. 4]
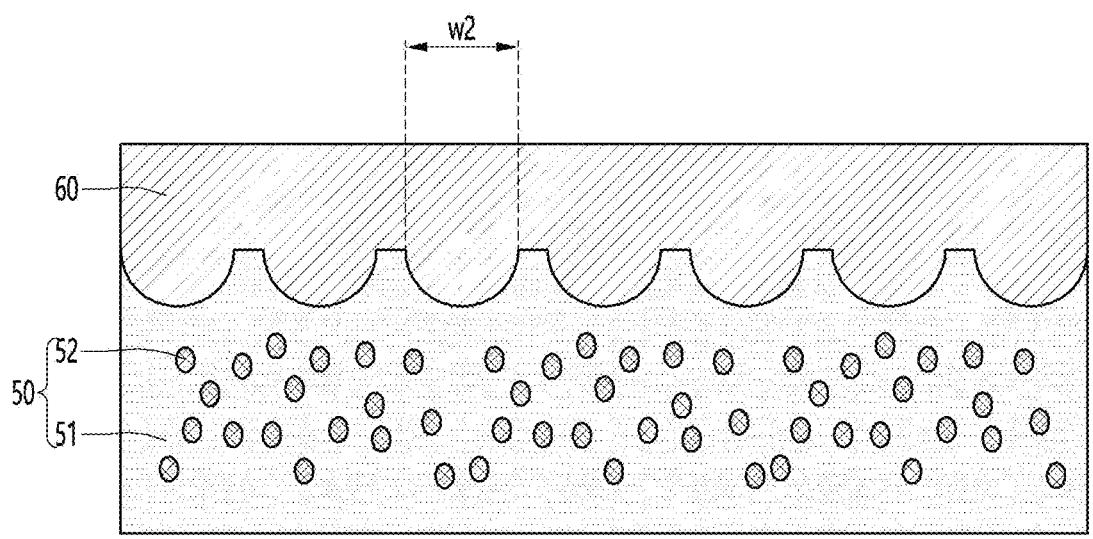

[FIG. 5]
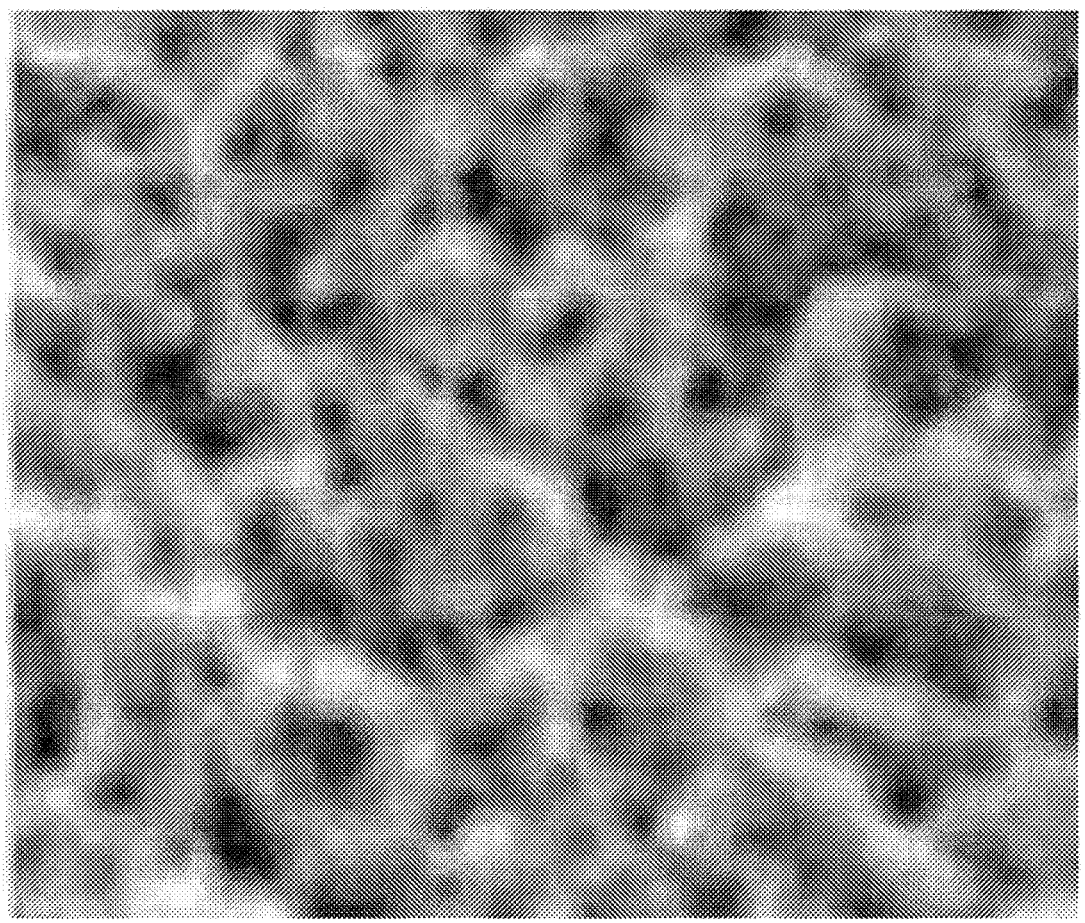
[FIG. 6]
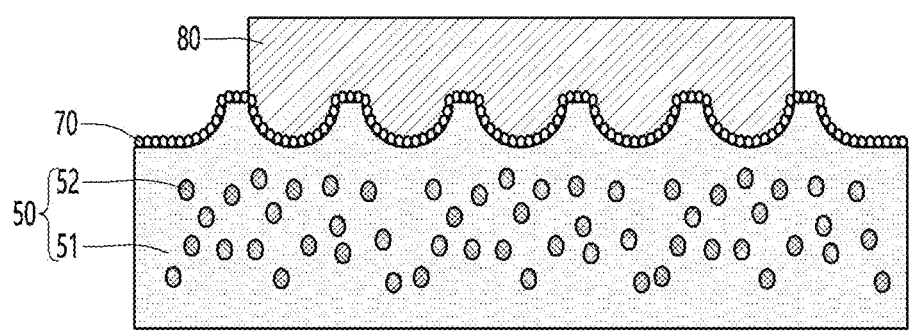

[FIG. 7]
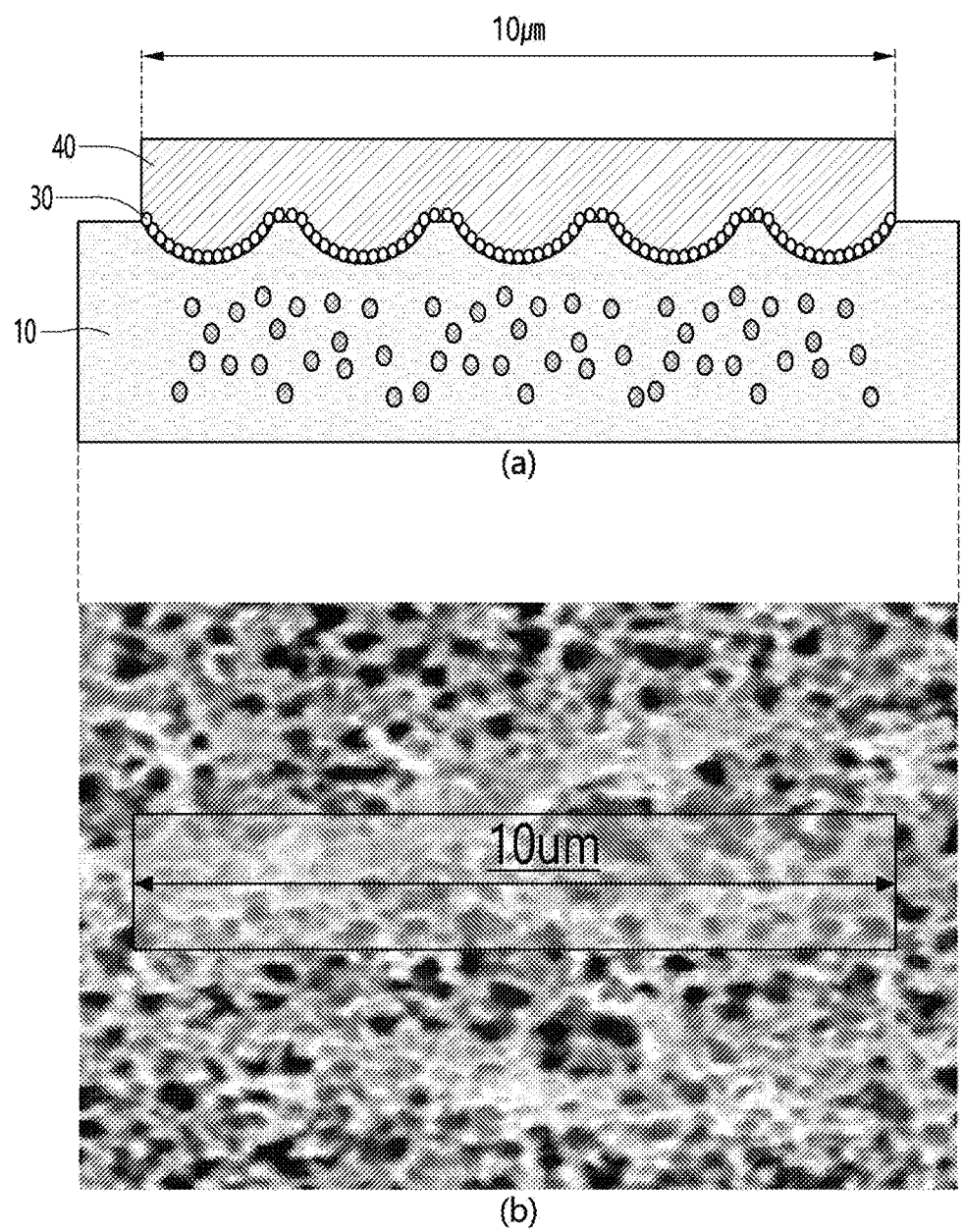

[FIG. 8]
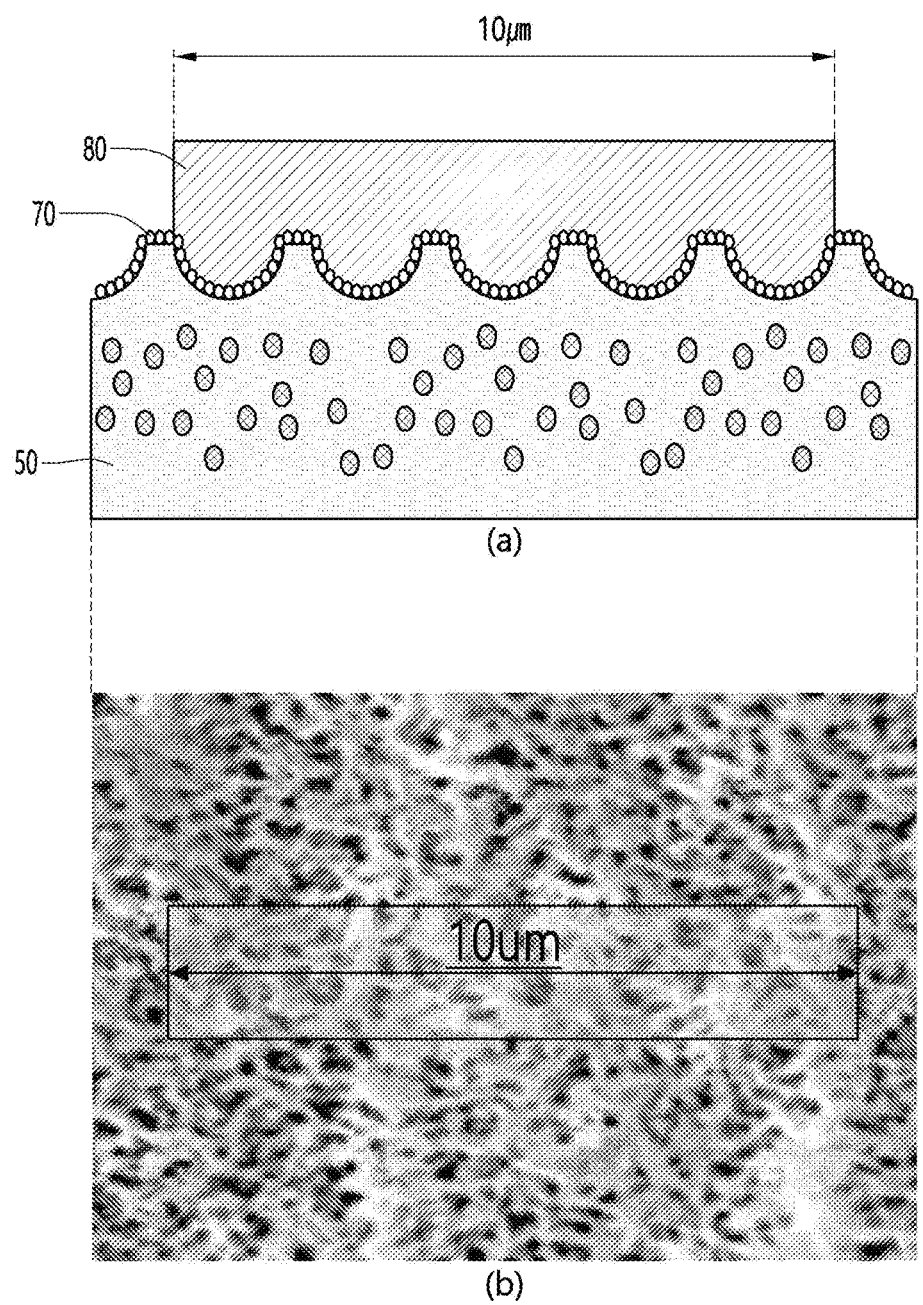

[FIG. 9]
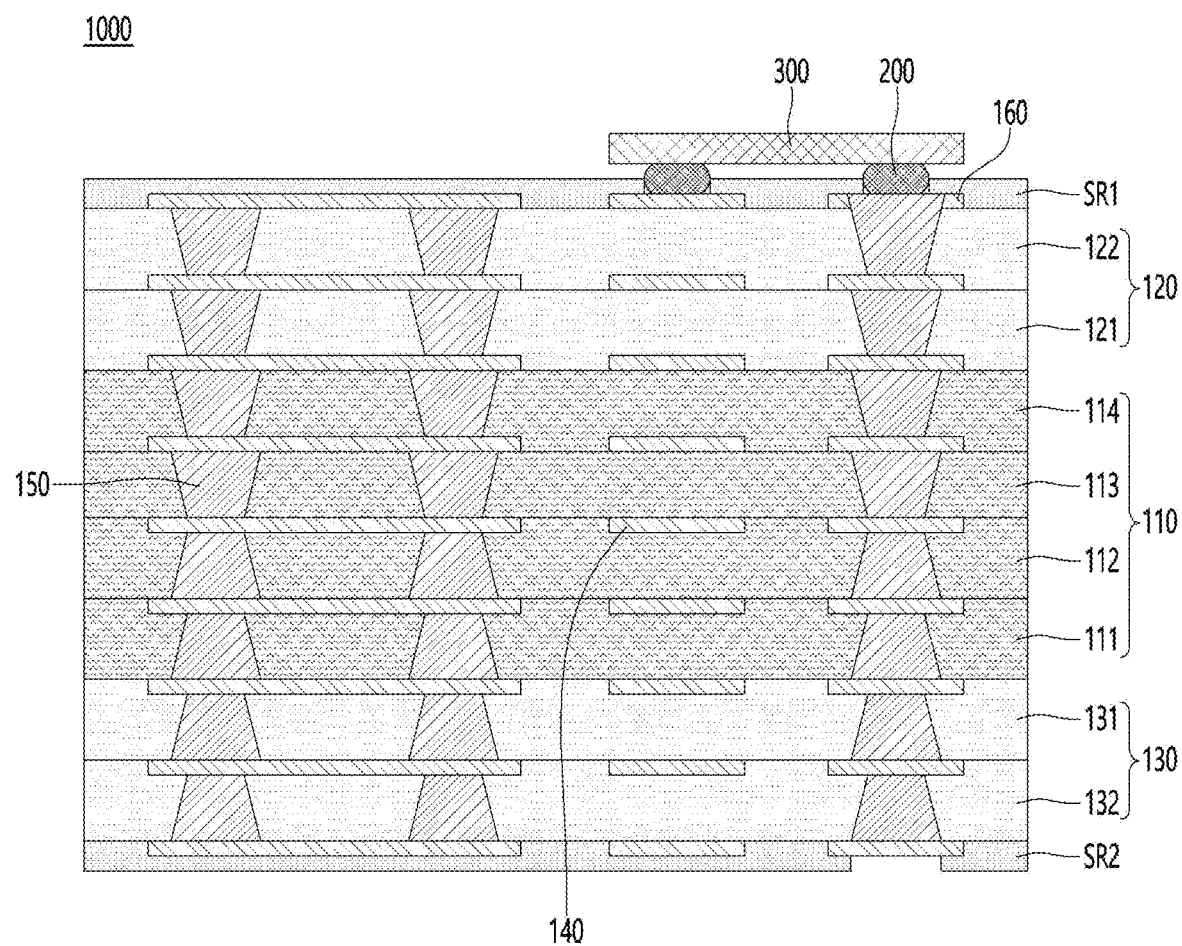
[FIG. 10]
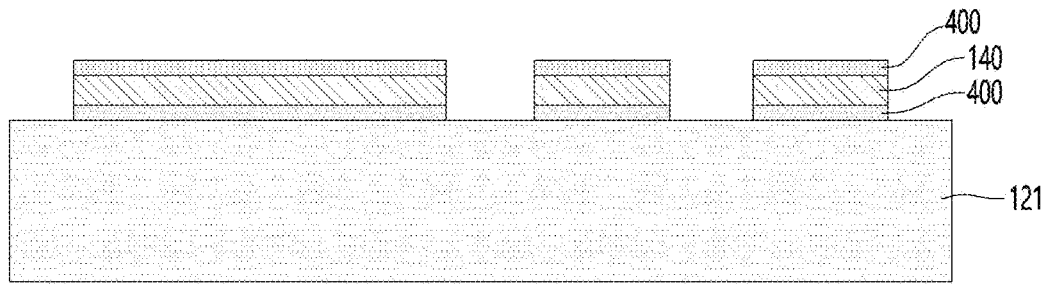

[FIG. 11]
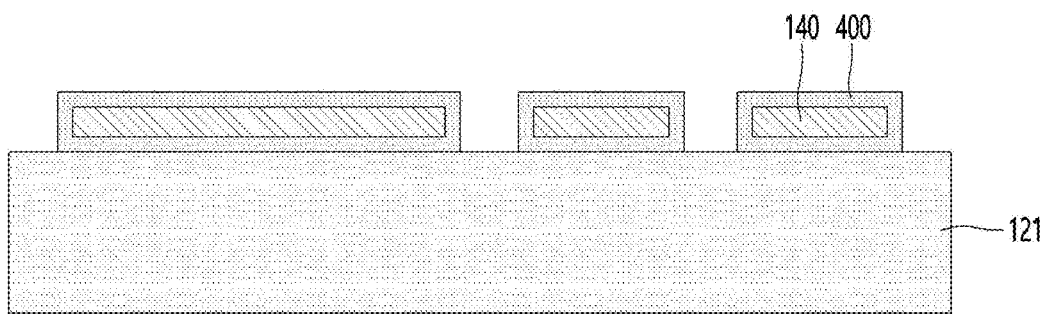
[FIG. 12]
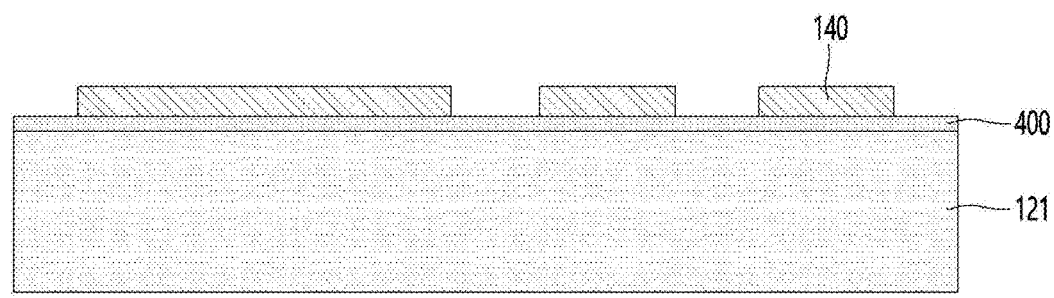
[FIG. 13]
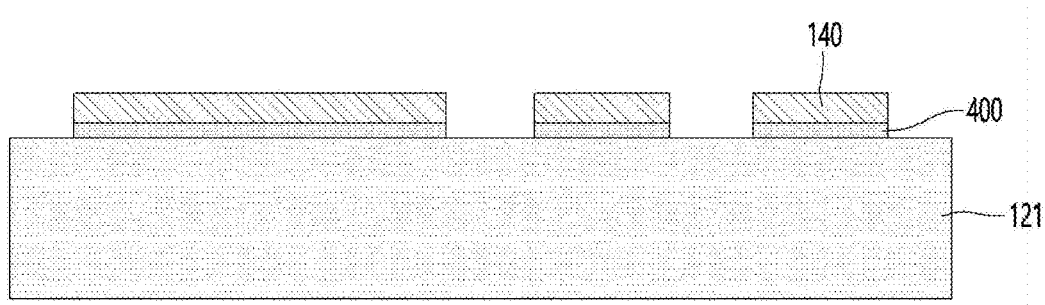

[FIG. 14]
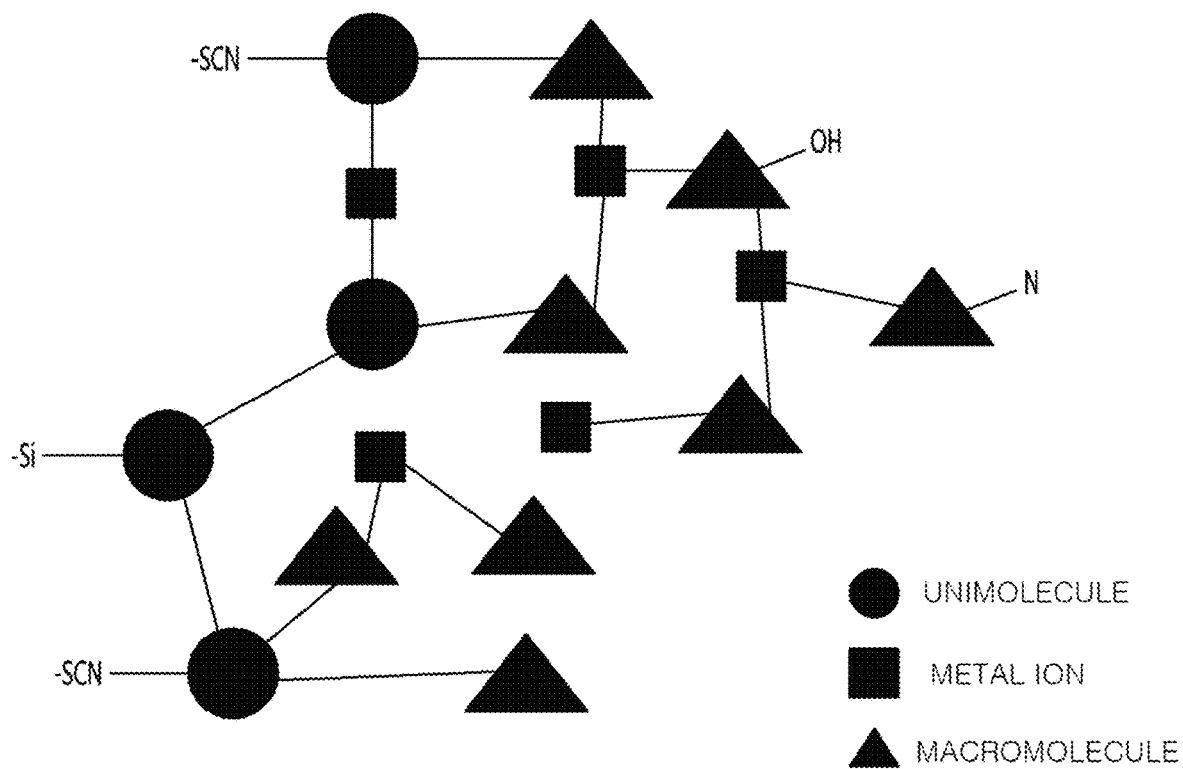

[FIG. 15]
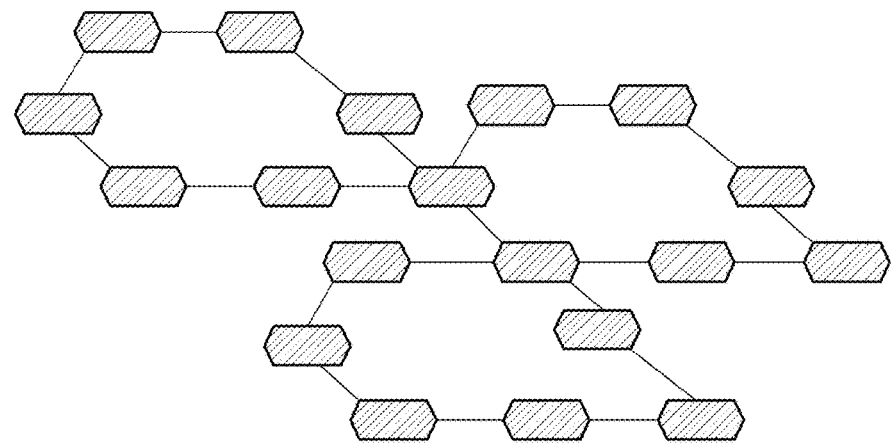
[FIG. 16]
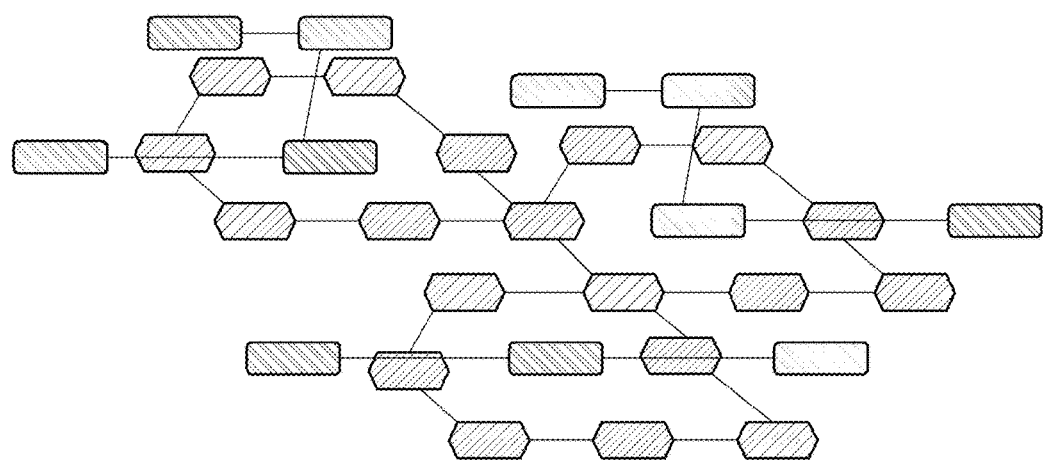

[FIG. 17]
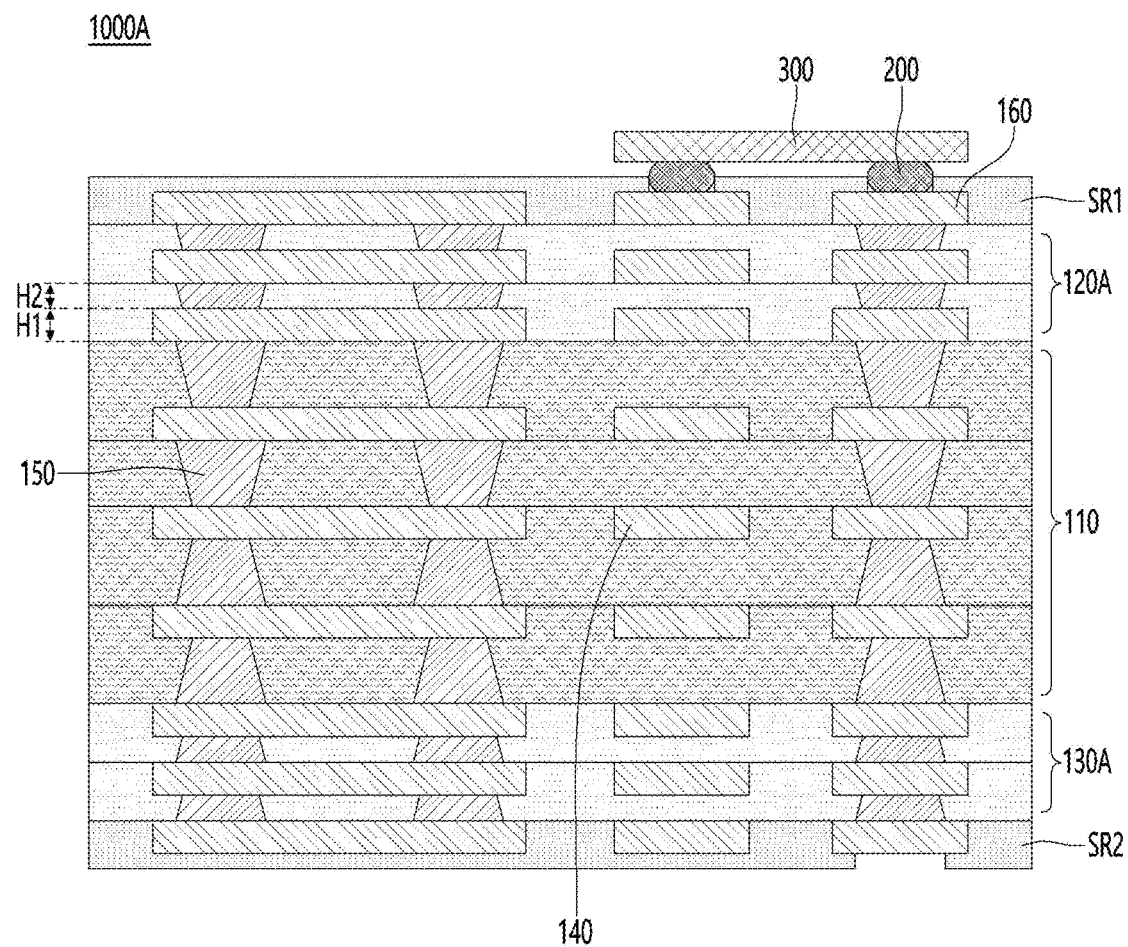

RESIN COATED COPPER AND CIRCUIT BOARD INCLUDING THE SAME

CROSS-REFERENCE TO RELATED PATENT APPLICATIONS

This application is a U.S. National Stage Application under 35 U.S.C. § 371 of PCT Application No. PCT/KR2021/007604, filed Jun. 17, 2021, which claims priority to Korean Patent Application No. 10-2020-0073573, filed Jun. 17, 2020, whose entire disclosures are hereby incorporated by reference.

TECHNICAL FIELD

The embodiment relates to a resin coated copper, and more particularly, to resin coated copper capable of realizing fine circuit patterns and improving adhesion with circuit patterns, and to a circuit board including the same.

BACKGROUND ART

A printed circuit board (PCB) is formed by printing a circuit line pattern on an electrically insulating substrate with a conductive material such as copper, and refers to a board immediately before mounting electronic components. That is, in order to densely mount many types of electronic devices on a flat plate, it means a circuit board on which a mounting position of each part is determined and a circuit pattern connecting the parts is printed on the flat plate surface and fixed.

The components mounted on the printed circuit board may transmit signals generated from the components by a circuit pattern connected to each component.

On the other hand, the signals are becoming higher in frequency in order to process a large amount of information at high speed with the recent high functionality of portable electronic devices, etc. and accordingly, the circuit patterns of printed circuit boards suitable for high-frequency applications are required.

A reduction in transmission loss is desired in order to enable transmission of such a circuit pattern of a printed circuit board without degrading the quality of a high-frequency signal.

A transmission loss of a circuit pattern of a printed circuit board mainly consists of a conductor loss due to a metal thin film such as copper and a dielectric loss due to a dielectric material such as an insulating layer.

The conductor loss due to the metal thin film is related to a surface roughness of the circuit pattern. That is, when the surface roughness of the circuit pattern increases, transmission loss may increase due to a skin effect.

Therefore, when the surface roughness of the circuit pattern is reduced, although it has an effect of preventing a reduction in transmission loss, there is a problem in that the adhesive force between the circuit pattern and the insulating layer is reduced.

In addition, the insulating layer of the circuit board may be formed of a material having a low dielectric constant, and thus transmission loss due to the dielectric material may be reduced.

However, the insulating layer in a circuit board for high frequency use requires chemical and mechanical properties for use in a circuit board in addition to a low dielectric constant.

In detail, the insulating layer used in a circuit board for high frequency applications must have isotropy of electrical properties for ease of circuit pattern design and process, low reactivity with metal wiring materials, low ionic conductivity and sufficient mechanical strength to withstand processes such as chemical mechanical polishing (CMP), low moisture absorptivity to prevent delamination or increase in dielectric constant, heat resistance to withstand processing temperatures, low coefficient of thermal expansion to eliminate cracking with temperature changes.

In addition, the insulating layer used in the circuit board for high-frequency applications must satisfy various conditions such as adhesion that can minimize various stresses and peeling that can occur at interfaces with other materials (eg, metal thin films), crack resistance, low stress, and low high-temperature gas generation.

Accordingly, the insulating layer used in the circuit board for high-frequency applications should preferentially have low dielectric constant and low coefficient of thermal expansion characteristics, and accordingly, the overall thickness of the circuit board can be reduced.

However, when manufacturing a circuit board using an insulating layer of a low-k material thinner than a limit, reliability problems such as warpage, cracks and peeling are occurring, and accordingly, reliability problems such as warping, cracking, and peeling increase as the number of layers of the insulating layer of the low-k material increases.

Therefore, there is a demand for a method capable of implementing a fine circuit pattern while slimming a circuit board by using an insulating layer of a low-k material, and solving reliability problems such as warpage, cracking, and peeling.

DISCLOSURE

Technical Problem

An embodiment provides a slimmed circuit board.

In addition, the embodiment provides a resin coated copper having a low dielectric constant and low surface roughness and a printed circuit board including the same.

In addition, the embodiment provides a resin coated copper having a low coefficient of thermal expansion and a printed circuit board including the same.

In addition, the embodiment provides a hybrid type printed circuit board having a mixed laminated structure of a resin coated copper and a prepreg.

In addition, the embodiment provides a circuit board capable of minimizing warpage by controlling a coefficient of thermal expansion of the resin coated copper to correspond to a coefficient of thermal expansion of the prepreg.

In addition, the embodiment provides a circuit board capable of controlling a coefficient of thermal expansion of the resin coated copper according to a total number of layers of the resin coated copper in an entire laminated structure of the printed circuit board.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A resin coated copper according to an embodiment includes: an insulating layer including a resin and a filler dispersed in the resin; and a copper foil layer disposed on the insulating layer, wherein the insulating layer has a plurality of pores formed on a surface in contact with the copper foil layer, and the plurality of pores have a width of 200 nm to 350 nm.

In addition, the copper foil layer includes a copper particle, wherein the copper particle have a diameter of 200 nm to 350 nm, and wherein the pore is a recess formed on the surface of the insulating layer to correspond to the copper particle.

In addition, the insulating layer has 30 to 50 pores within a virtual line having a length of 10 μm on the surface.

In addition, the insulating layer has a center line average surface roughness (Ra) of about 0.1 μm to 0.15 μm.

In addition, the insulating layer has a ten-point average surface roughness (Rz) of 0.8 μm to 1.5 μm.

On the other hand, a printed circuit board according to an embodiment includes: an insulating layer; a plating layer disposed on an upper surface of the insulating layer; and a circuit pattern disposed on an upper surface of the plating layer, wherein the first insulating layer is a resin coated copper (RCC), wherein the insulating layer has a plurality of pores formed on a surface in contact with the copper foil layer, and the plurality of pores have a width of 200 nm to 350 nm.

In addition, the circuit pattern has a first line width and overlaps 30 to 50 pores among the plurality of pores formed in the insulating layer within the first line width in a vertical direction.

In addition, the insulating layer has a center line average surface roughness (Ra) of about 0.1 μm to 0.15 μm and a ten-point average surface roughness (Rz) of 0.8 μm to 1.5 μm.

On the other hand, a printed circuit board according to an embodiment includes: an insulating part including a plurality of insulating layers, wherein the insulating part includes: a first insulating part; a second insulating part disposed on the first insulating part and having a coefficient of thermal expansion corresponding to the first insulating part; and a third insulating part disposed under the first insulating part and having a coefficient of thermal expansion corresponding to the first insulating part; wherein the first insulating part is made of a prepreg containing glass fibers, wherein the second and third insulating parts are made of resin coated copper, and wherein an insulating layer of each of the first and second insulating parts has a plurality of pores formed on a surface of the insulating layer and having a width of 200 nm to 350 nm.

In addition, the insulating layer has a center line average surface roughness (Ra) of about 0.1 μm to 0.15 μm and a ten-point average surface roughness (Rz) of 0.8 μm to 1.5 μm.

In addition, the resin coated copper constituting the second and third insulating parts has a number of layers in a range of 30% to 50% of a total number of insulating layers constituting the first to third insulating parts or a thickness in a range of 30% to 50% of a total thickness of the insulating layer constituting the first to third insulating parts, and has a coefficient of thermal expansion in a range of 10 to 50 ($10^{-6}$ m/m·k).

In addition, the resin coated copper constituting the second and third insulating parts includes a resin and a filler dispersed in the resin, and the filler has a content pf 55 wt % to 70 wt %.

In addition, each of the insulating layers constituting the second and third insulating parts includes a first compound including polyphenyl ether (PPE); and a second compound including tricyclodecane and a terminal group connected to the tricyclodecane, and wherein a weight ratio of the first compound to the second compound is 4:6 to 6:4.

In addition, the terminal group includes at least one of an acrylate group, an epoxide group, a carboxyl group, a hydroxyl group, and an isocyanate group, and the first compound and the second compound are not chemically bound.

In addition, a dielectric constant of the resin coated copper is 2.03 to 2.7.

Advantageous Effects

A resin coated copper in the embodiment includes an insulating layer and a copper foil layer. In this case, a diameter of a copper particle in the copper foil layer has a range of 200 nm to 350 nm. Accordingly, a pore is formed on the surface of the insulating layer of the resin coated copper of the embodiment, and the pore has a width of 200 nm to 350 nm. In addition, the insulating layer of the embodiment may have a center line average surface roughness (Ra) of about 0.1 μm to 0.15 μm and a ten-point average surface roughness (Rz) of 0.8 μm to 1.5 μm. That is, the resin coated copper of the embodiment can reduce a surface roughness of the insulating layer compared to a comparative example, accordingly, it is possible to implement a fine circuit pattern and minimize signal transmission loss. In addition, the embodiment may allow a pore having a width ranging from 200 nm to 350 nm to be formed on the surface of the insulating layer, and accordingly, a density of the fore can be improved. That is, a number of the pore formed in a certain region of the insulating layer of the embodiment may be increased compared to a number of the pore formed in the insulating layer of the comparative example. For example, the number of the pore formed in a certain region of the insulating layer of the embodiment may be increased by 2 to 5 times compared to the number of the pore formed in the insulating layer of the comparative example. In addition, the embodiment improves the density of the pores formed on the surface of the insulating layer, accordingly, a contact area with a chemical copper plating layer formed later can be increased, and thus adhesion with the chemical copper plating layer and further with the circuit pattern can be improved.

In addition, the printed circuit board according to the embodiment may include a buffer layer disposed between the insulating layer and the circuit pattern. That is, the buffer layer of the printed circuit board according to the embodiment may be formed on the surface of the circuit pattern or on the insulating layer. The buffer layer may be disposed between the insulating layer and the circuit pattern to improve adhesion between the insulating layer and the circuit pattern. That is, the insulating layer and the circuit pattern are heterogeneous materials including a resin material and a metal, respectively, and when the circuit pattern is formed on the insulating layer, there is a problem that adhesion is reduced. Accordingly, adhesion between the insulating layer and the circuit pattern may be improved by disposing the buffer layer chemically bonded to the insulating layer and the circuit pattern between the insulating layer and the circuit pattern.

That is, the buffer layer includes a plurality of functional groups coupled to the insulating layer and the circuit pattern, the functional groups are chemically bonded to the insulating layer and the circuit pattern by a covalent bond or a coordination bond, and thereby adhesion between the insulating layer and the circuit pattern may be improved.

Accordingly, even when the surface roughness of the insulating layer is reduced, it is possible to secure adhesion reliability between the insulating layer and the circuit pattern.

Therefore, when the circuit board according to the embodiment is used for high frequency applications, ae transmission loss of the high-frequency signal can be reduced as the surface roughness of the circuit pattern is lowered, and even if the surface roughness of the circuit pattern is lowered, adhesion between the insulating layer and the circuit pattern can be secured by the buffer layer, and thus overall reliability of the circuit pattern can be secured.

In addition, the circuit board according to the embodiment may include an insulating layer having improved strength with a low dielectric constant and a low coefficient of thermal expansion.

In detail, the insulating layer includes a first material and a second material having a low dielectric constant and improved strength, and the first material may be disposed inside the network structure of the second material in the insulating layer, and thus phase separation between the first material and the second material may be prevented. Accordingly, the insulating layer may be formed of the first material and the second material in a single phase, and thus, strength of the insulating layer may be improved.

That is, it is possible to increase a free volume, that is, molecular motion, of the second material having a network structure by cross-linking, and it can be structured so that polymer chains having a network structure are not closely arranged, and accordingly, the first material and the second material may be formed to have a single phase in the insulating layer as the first material is partially disposed inside the network structure.

Therefore, when the circuit board according to the embodiment is used for high-frequency applications, it is possible to reduce the transmission loss of the high-frequency signal by reducing the dielectric constant of the insulating layer, and the overall reliability of the circuit board can be secured by improving the coefficient of thermal expansion and mechanical strength of the insulating layer.

DESCRIPTION OF DRAWINGS

FIG. 1 is a cross-sectional view showing a resin coated copper according to a comparative example.

FIG. 2 is a view showing an interface state of a resin coated copper according to a comparative example.

FIGS. 3 (a) to (c) are views for explaining reliability evaluation of a printed circuit board according to a comparative example.

FIG. 4 is a cross-sectional view showing a resin coated copper according to an embodiment.

FIG. 5 is a view showing an interface state of a resin coated copper according to an embodiment.

FIG. 6 is a view showing a printed circuit board according to an embodiment.

FIGS. 7 (a) and (b) and 8 (a) and (b) are views for comparing reliability in printed circuit boards of comparative examples and embodiments.

FIG. 9 is a cross-sectional view of a printed circuit board according to a first embodiment.

FIGS. 10 to 13 are views for explaining a position and an arrangement relationship of the buffer layer 400.

FIG. 14 is a view showing a simple structural formula of a buffer layer of a printed circuit board according to an embodiment.

FIG. 15 is a view showing a structure of a second material included in an insulating layer of a printed circuit board according to an embodiment.

FIG. 16 is a view showing an arrangement structure of a first material and a second material included in an insulating layer of a printed circuit board according to an embodiment.

FIG. 17 is a cross-sectional view of a printed circuit board according to a second embodiment.

DETAILED DESCRIPTION OF THE EMBODIMENTS

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and substituted for use.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

Further, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements.

Further, when expressed as "on (over)" or "under (below)", it may include not only the upper direction but also the lower direction based on one element.

Hereinafter, a resin coated copper according to embodiments and a printed circuit board including the same will be described with reference to drawings.

Prior to the description of this embodiment, the resin coated copper according to the comparative example will be preferentially described.

FIG. 1 is a cross-sectional view showing a resin coated copper according to a comparative example, FIG. 2 is a view showing an interface state of a resin coated copper according to a comparative example, and FIG. 3 is a view for explaining reliability evaluation of a printed circuit board according to a comparative example.

Referring to FIGS. 1 to 3, a resin coated copper of a comparative example includes an insulating layer 10 and a copper foil layer 20.

The insulating layer 10 includes a resin 11 and a filler 12 dispersed in the resin 11.

In addition, the copper foil layer 20 is disposed on at least one surface of the insulating layer 10. The copper foil layer 20 may be disposed on only one side of both sides of the insulating layer 10, or may be disposed on both sides.

A pore having a first width w1 is formed on the surface of the insulating layer. The pore is represented by a protrusion formed on the surface of the copper foil layer 20.

That is, the resin coated copper may be manufactured by disposing the copper foil layer 20 on the insulating layer 10 and performing a compression process. In this case, the copper foil layer 20 includes a copper particle. In addition, a protrusion having a size corresponding to a diameter of the copper particle may be formed on the surface of the copper foil layer.

In this case, the pore is formed on the surface of the insulating layer 10 to correspond to the protrusion on the surface of the copper foil layer 20 in the process of attaching the insulating layer 10 and the copper foil layer 20. In this case, the pore corresponds to a diameter of the copper particle constituting the copper foil layer 20.

For example, the diameter of the copper particle constituting the copper foil layer 20 in the comparative example has a range between 400 nm and 800 nm.

Accordingly, the pore formed on the surface of the insulating layer 10 in the comparative example has a range of 400 nm to 800 nm.

In addition, the insulating layer 10 of the comparative example has a center line average surface roughness (Ra) of about 0.21 μm and a ten-point average surface roughness (Rz) of about 2.1 μm.

In this case, the insulating layer 10 in the comparative example as described above has a problem in that the density of the pore constituting a surface roughness is relatively low, and thus the adhesion to the circuit pattern is reduced.

That is, the printed circuit board of the comparative example includes a chemical copper plating layer 30 formed on the surface of the insulating layer 10 after removing the copper foil layer 20 included in the resin coated copper as shown in FIG. 3 (a). In addition, the printed circuit board of the comparative example includes a circuit pattern 40 formed on the chemical copper plating layer 30 through an electrolytic plating process, as shown in FIG. 3 (b).

However, in the printed circuit board of the comparative example manufactured as described above, adhesion between the chemical copper plating layer 30, the circuit pattern 40, and the insulating layer 10 is relatively low.

Accordingly, when a certain force is applied in a trace shear direction as shown in FIG. 3 (c), the printed circuit board in the comparative example has a problem in that the chemical copper plating layer 30 and the circuit pattern 40 are separated or peeled from the insulating layer 10.

In this case, it can be solved by increasing a surface roughness of the insulating layer 10 in order to increase adhesion between the insulating layer 10 and the chemical copper plating layer 30. However, when the surface roughness of the insulating layer 10 is increased, transmission loss of a signal increases. In addition, when the surface roughness of the insulating layer 10 is increased, it is difficult to implement a fine circuit pattern.

Therefore, the embodiment provides a resin coated copper capable of reducing signal transmission loss by lowering the surface roughness of the insulating layer and improving the adhesion between the insulation layer and the chemical copper plating layer and furthermore, the adhesion with the circuit pattern, and a printed circuit including the same.

FIG. 4 is a cross-sectional view showing a resin coated copper according to an embodiment, FIG. 5 is a view showing an interface state of a resin coated copper according to an embodiment, and FIG. 6 is a view showing a printed circuit board according to an embodiment.

Referring to FIGS. 4 to 6, the resin coated copper of an embodiment includes an insulating layer 50 and a copper foil layer 60.

The insulating layer 50 may include a resin 51 and a filler 52 dispersed in the resin 51.

In this case, a content of the filler 52 dispersed in the insulating layer 50 in the embodiment may be 55 wt % to 70 wt % by weight. In addition, the filler 52 in the embodiment may include an F functional group constituting a low dielectric constant and a low coefficient of thermal expansion, thereby improving electrical characteristics.

In addition, the copper foil layer 60 is disposed on at least one surface of the insulating layer 50. The copper foil layer 60 may be disposed on only one side of both sides of the insulating layer 50, or may be disposed on both sides.

A pore having a second width w2 is formed on the surface of the insulating layer. The pore is represented by a protrusion formed on a surface of the copper foil layer 60.

That is, the resin coated copper may be manufactured by disposing the copper foil layer 60 on the insulating layer 50 and performing a compression process. In this case, the copper foil layer 50 includes a copper particle. In addition, a protrusion having a size corresponding to a diameter of the copper particle may be formed on the surface of the copper foil layer.

In this case, the pore is formed on the surface of the insulating layer 50 to correspond to the protrusion on the surface of the copper foil layer 60 in the process of attaching the insulating layer 50 and the copper foil layer 60. In this case, the pore corresponds to the diameter of the copper particle constituting the copper foil layer 60.

That is, the pore may refer to a recess portion on the surface of the insulating layer 50 that is not filled with resin. In addition, the pore is formed by the protrusion corresponding to the copper particle of the copper foil layer 20. Accordingly, the pore may also be referred to as a groove or a recess corresponding to the protrusion of the copper foil layer 20.

For example, a diameter of the copper particle constituting the copper foil layer 60 in the embodiment has a range of 200 nm to 350 nm. Accordingly, the pore formed on the surface of the insulating layer 50 in the embodiment has a range of 200 nm of 350 nm.

In addition, the insulating layer 50 of this embodiment may have a center line average surface roughness (Ra) of about 0.1 μm to about 0.15 μm and a ten-point average surface roughness (Rz) of 0.8 μm to 1.5 μm. That is, the resin coated copper of the embodiment can reduce the surface roughness of the insulating layer 50 compared to the comparative example, thereby enabling the implementation of a fine circuit pattern and minimizing signal transmission loss.

However, when the surface roughness is reduced, adhesion between the insulating layer 50 and the chemical copper plating layer may decrease.

In this case, a pore having a range of 200 nm to 350 nm is formed on the surface of the insulating layer 50 in the embodiment. In other words, the pore having a higher density than the comparative example may be formed on the surface of the insulating layer 50 in the embodiment.

Accordingly, a number of the pore formed in a certain region of the insulating layer 50 of the embodiment may be increased compared to a number of the pore formed in the insulating layer 10 of the comparative example. For example, the number of the pore formed in a certain region of the insulating layer 50 of the embodiment may be increased by 2 to 5 times compared to the number of the pore formed in the insulating layer 10 of the comparative example.

In addition, the embodiment improves the density of the pore formed on the surface of the insulating layer 50, accordingly, a contact area with a chemical copper plating layer formed later can be increased, and thus adhesion with the chemical copper plating layer and further with the circuit pattern can be improved.

That is, as shown in FIG. 6, in the printed circuit board in the embodiment, a chemical copper plating layer 70 is formed on the surface of the insulating layer 50 after removing the copper foil layer 60 included in the resin coated copper. In addition, the circuit pattern 80 of the printed circuit board in the embodiment, is formed by electrolytic plating using the chemical copper plating layer 70. Meanwhile, the circuit pattern 80 may be a fine circuit pattern. For example, the circuit pattern 80 may be a trace. For example, the circuit pattern 80 may be a trace of a fine circuit pattern having a line width of 10 μm.

At this time, the embodiment increases the density of the pore formed on the surface of the insulating layer 50 compared to the comparative example, and accordingly, the number of the pore overlapping the circuit pattern 80 having the fine line width in a vertical direction may be increased compared to the comparative example. In addition, this can increase a contact area between the insulating layer 50 and the chemical copper plating layer 70, and further increase a contact area between the circuit pattern 80 and the chemical copper plating layer 70. Accordingly, the embodiment can increase adhesion between the insulating layer 50, the chemical copper plating layer 70, and the circuit pattern 80 compared to the comparative example, and thus improve reliability compared to the comparative example.

FIGS. 7 and 8 are views for comparing reliability in printed circuit boards of comparative examples and embodiments.

FIG. 7 is a view for explaining adhesion characteristics in a printed circuit board of a comparative example, and FIG. 8 is a view for explaining adhesion characteristics in a printed circuit board of an embodiment.

Referring to FIG. 7, a general fine circuit pattern has a line width of about 10 μm.

In addition, the pore having a size of 400 nm to 800 nm are formed on the surface of the insulating layer of the comparative example in FIG. 7.

Accordingly, 12 to 25 pores are formed in a 10 μm area of the fine circuit pattern in the comparative example. That is, the fine circuit pattern in the comparative example may be formed by overlapping 12 to 25 pores in a vertical direction. For example, 12 to 25 pores may be positioned in a vertical line of 10 μm in the insulating layer of the comparative example.

Referring to FIG. 8, the pore having a size of 20 nm to 350 nm are formed on the surface of the insulating layer in the embodiment.

Accordingly, 30 to 50 pores are formed in a 10 μm area of the fine circuit pattern in the embodiment. That is, the fine circuit pattern in the embodiment may be formed by overlapping 30 to 50 pores in a vertical direction. That is, the chemical copper plating layer 70 in the embodiment may contact 30 to 50 pores in a virtual line of 10 μm.

For example, 30 to 50 pores may be positioned in a virtual line of 10 μm in the insulating layer in the embodiment. In other words, a number of the pore in the insulating layer of the embodiment may be more than doubled compared to that of the insulating layer of the comparative example in the same region. Accordingly, in the embodiment, the contact area between the insulating layer and the chemical copper plating layer may be increased, and thus adhesion may be improved.

FIG. 9 is a cross-sectional view of a printed circuit board according to a first embodiment.

Referring to FIG. 9, a printed circuit board 1000 according to the first embodiment may be included an insulating substrate including first to third insulating parts 110, 120 and 130, a first pad 160, a first protective layer SR1, a second protective layer SR2, a solder paste 200, and an electronic component 300.

The insulating substrate including the first to third insulating parts 110, 120 and 130 may have a flat structure. The insulating substrate may be a printed circuit board (PCB). Here, the insulating substrate may be implemented as a single substrate, or alternatively, may be implemented as a multilayer substrate in which a plurality of insulating layers are sequentially stacked.

Accordingly, the insulating substrate may include a plurality of insulating parts 110, 120, 130. As shown in FIG. 9, the plurality of insulating parts includes the first insulating part 110, a second insulating part 120 disposed on the first insulating part 110, and a third insulating part 130 disposed below the first insulating part 110.

In this case, the first insulating part 110, the second insulating part 120, and the third insulating part 130 may be formed of different insulating materials. Preferably, the first insulating part 110 may include glass fiber. Also, unlike the first insulating part 110, the second insulating part 120 and the third insulating part 130 may not include the glass fiber.

Accordingly, a thickness of each insulating layer constituting the first insulating part 110 may be different from a thickness of each insulating layer constituting the second insulating part 120 and the third insulating part 130. In other words, a thickness of each insulating layer constituting the first insulating part 110 may be greater than a thickness of each insulating layer constituting the second insulating part 120 and the third insulating part 130.

That is, the first insulating part 110 includes a glass fiber. The glass fiber generally has a thickness of about 12 μm. Accordingly, a thickness of each insulating layer constituting the first insulating part 110 includes a thickness of the glass fiber, and may be in a range of 19 μm to 23 μm.

Alternatively, the glass fiber is not included in the second insulating part 120. Preferably, each insulating layer constituting the second insulating part 120 may be composed of a resin coated copper (RCC). Specifically, the second insulating part 120 may be made of the resin coated copper shown in FIGS. 4 to 6.

Accordingly, a thickness of each insulating layer constituting the second insulating part 120 may range from 10 μm to 15 μm. Preferably, a thickness of each layer of the second insulating part 120 made of the resin coated copper may be formed within a range not exceeding 15 μm.

In addition, the glass fiber is not included in the third insulating part 130. Preferably, each insulating layer constituting the third insulating part 130 may be composed of a resin coated copper (RCC). Specifically, the third insulating part 130 may be made of the resin coated copper shown in FIGS. 4 to 6. Accordingly, a thickness of each insulating layer constituting the third insulating part 130 may range from 10 µm to 15 µm.

That is, the insulating part constituting the printed circuit board in a comparative example includes a plurality of insulating layers, and the plurality of insulating layers are composed of a prepreg (PPG) including glass fibers. In this case, it is difficult to reduce the thickness of the glass fiber based on the PPG of the printed circuit board in the comparative example. This is because, when the thickness of the PPG is reduced, the glass fibers included in the PPG may be electrically connected to a circuit pattern disposed on a surface of the PPG, and thus a crack risk is induced. When the thickness of the PPG of the printed circuit board of the comparative example is reduced, dielectric breakdown and circuit pattern damage may occur. Accordingly, the circuit board in the comparative example had a limit in reducing an overall thickness due to the thickness of the glass fibers constituting the PPG.

In addition, the printed circuit board of the comparative example is composed of an insulating layer made of only PPG containing glass fibers, and thus has a high dielectric constant. However, a dielectric having a high dielectric constant is difficult to approach as a substitute for high frequencies. That is, the circuit board of the comparative example has a high dielectric constant of glass fiber, and accordingly, a problem in which the dielectric constant is broken in a high frequency band occurs.

Accordingly, in the embodiment, the insulating layer is formed using the resin coated copper having a low dielectric constant, thereby reducing the thickness of the circuit board and providing a highly reliable circuit board in which signal loss is minimized even in a high frequency band. This may be achieved by properties of materials in each insulating layer constituting the second insulating part 120 and the third insulating part 130, which will be described in more detail below.

The first insulating part 110 may include a first insulating layer 111, a second insulating layer 112, a third insulating layer 113, and a fourth insulating layer 114 from a lower portion. In addition, each of the first insulating layer 111, the second insulating layer 112, the third insulating layer 113, and the fourth insulating layer 114 may be made of PPG including glass fibers.

On the other hand, the insulating substrate of the embodiment of the present application may be composed of 8 layers based on the insulating layer. However, the embodiment is not limited thereto and a total number of layers of the insulating layer may be increased or decreased.

In addition, the first insulating part 110 according to the first embodiment may be composed of four layers. For example, the first insulating part 110 of the first embodiment may be composed of four layers of prepreg.

In addition, the second insulating part 120 may include a fifth insulating layer 121 and a sixth insulating layer 122 from a lower portion. The fifth insulating layer 121 and the sixth insulating layer 122 constituting the second insulating part 120 may be made of a resin coated copper having a low dielectric constant and a low coefficient of thermal expansion. That is, in the first embodiment, the second insulating part 120 may be composed of two layers. For example, in the first embodiment, the second insulating part 120 may be composed of two layers of resin coated copper.

In addition, the third insulating part 130 may include a seventh insulating layer 131 and an eighth insulating layer 132 from an upper portion. The seventh insulating layer 131 and the eighth insulating layer 132 constituting the third insulating part 130 may be made of resin coated copper having a low dielectric constant and a low coefficient of thermal expansion. That is, in the first embodiment, the third insulating part 130 may be composed of three layers. For example, in the first embodiment, the third insulating part 130 may be composed of three layers of dielectric resin coated copper.

On the other hand, it is showed in the first embodiment that a total number of layers of the insulating layer of the first embodiment is 8, wherein the first insulating part 110 formed of prepreg is formed of four layers, and each of the second insulating part 120 and the third insulating part 130 formed of resin coated copper is formed in two layers, and but the embodiment is not limited thereto, and the number of insulating layers constituting the first insulating part 110 may increase or decrease.

However, the coefficient of thermal expansion (CTE) of each insulating layer constituting the second insulating part 120 and the third insulating part 130 of the embodiment may be determined based on the total number of layers of the second insulating part 120 and the third insulating part 130.

Preferably, the coefficient of thermal expansion (CTE) of each insulating layer constituting the second insulating part 120 and the third insulating part 130 may be determined based on a coefficient of thermal expansion (CTE) of the prepreg constituting the first insulating part 110. Specifically, the resin coated copper constituting the second insulating part 120 and the third insulating part 130 may basically have a coefficient of thermal expansion (CTE) in a first range corresponding to the coefficient of thermal expansion (CTE) of the prepreg constituting the first insulating part 110. Furthermore, the resin coated copper constituting the second insulating part 120 and the third insulating part 130 may have a coefficient of thermal expansion (CTE) in a second range smaller than the first range according to a total number of insulating layers thereof. In this case, the coefficient of thermal expansion (CTE) of the second range may be included in the first range. Meanwhile, the coefficient of thermal expansion (CTE) of the resin coated copper constituting the second insulating part 120 and the third insulating part 130 can be easily adjusted by adjusting the content of the filler included in the resin coated copper.

The coefficient of thermal expansion (CTE) of the RCC constituting the second insulating part 120 and the third insulating part 130 will be described in more detail below.

As described above, the printed circuit board according to the first embodiment includes the first insulating part 110, the second insulating part 120, and the third insulating part 130, and the first insulating part 110 may be made of PPG including glass fiber, and the second insulating part 120 and the third insulating part 130 may be formed of resin coated copper having a low dielectric constant for use in a circuit board applied to a high frequency application. In addition, the second insulating part 120 and the third insulating part 130 may secure mechanical/chemical safety while having a low dielectric constant, thereby improving the reliability of the circuit board.

Meanwhile, a circuit pattern 140 may be disposed on a surface of the insulating layer constituting each of the first insulating part 110, the second insulating part 120, and the third insulating part 130.

Preferably, a circuit pattern 140 may be disposed on at least one surface of each of the first insulating layer 111, the second insulating layer 112, the third insulating layer 113, the fourth insulating layer 114, the fifth insulating layer 121, the sixth insulating layer 122, the seventh insulating layer 131 and the eighth insulating layer 132.

The circuit pattern 140 is a wire that transmits an electrical signal, and may be formed of a metal material having high electrical conductivity. To this end, the circuit pattern 140 may be formed of at least one metal material selected from gold (Au), silver (Ag), platinum (Pt), titanium (Ti), tin (Sn), copper (Cu), and zinc (Zn).

In addition, the circuit pattern 140 may be formed of a paste or solder paste including at least one metal material selected from among gold (Au), silver (Ag), platinum (Pt), titanium (Ti), tin (Sn), copper (Cu), and zinc (Zn) having excellent bonding strength. Preferably, the circuit pattern 140 may be formed of copper (Cu), which has high electrical conductivity and is relatively inexpensive.

In addition, the circuit pattern 140 may have a thickness of 12 μm±2 μm. That is, the thickness of the circuit pattern may be in a range of 10 μm to 14 μm.

The circuit pattern 140 may be formed using additive process, subtractive process, MSAP (Modified Semi Additive Process), and SAP (Semi Additive Process) method, which is a typical printed circuit board manufacturing process possible, and a detailed description thereof will be omitted herein.

Meanwhile, a buffer layer 400 may be disposed on each of the insulating layers constituting the first insulating part 110, the second insulating part 120, and the third insulating part 130 and/or on the surface of the circuit pattern 140. In detail, the buffer layer 400 may be disposed on the surface of at least one of upper, lower, and side surfaces of the circuit pattern 140 or on the surface of the insulating layer on which the circuit pattern is disposed.

At least one via 150 is formed in at least one of the plurality of insulating layers constituting the first insulating part 110, the second insulating part 120, and the third insulating part 130. The via 150 is disposed to pass through at least one insulating layer among the plurality of insulating layers. The via 150 may pass through only one insulating layer among the plurality of insulating layers. Alternatively, the via 150 may be formed while passing through at least two insulating layers among the plurality of insulating layers in common. Accordingly, the via 150 electrically connects the circuit patterns disposed on the surfaces of different insulating layers to each other.

The via 150 may be formed by filling an inside of a through hole (not shown) passing through at least one insulating layer among the plurality of insulating layers with a conductive material.

When the through hole is formed by mechanical processing, methods such as milling, drilling, and routing may be used, and when the through hole is formed by laser processing, a UV or $CO_2$ laser method may be used, and when the through hole is formed by chemical processing, drugs containing aminosilane, ketones, etc. may be used, and the like, thereby the first insulating layer 110 may be opened.

On the other hand, the processing by the laser is a cutting method that takes the desired shape to melt and evaporate a part of the material by concentrating optical energy on the surface, it can easily process complex formations by computer programs, and can process composite materials that are difficult to cut by other methods.

In addition, the processing by the laser can have a cutting diameter of at least 0.005 μmm, and has a wide advantage in a range of possible thicknesses.

As the laser processing drill, it is preferable to use a YAG (Yttrium Aluminum Garnet) laser, a $CO_2$ laser, or an ultraviolet (UV) laser. The YAG laser is a laser that can process both the copper foil layer and the insulating layer, and the $CO_2$ laser is a laser that can process only the insulating layer.

When the through hole is formed, the via 150 is formed by filling the inside of the through hole with a conductive material. The metal material forming the via 150 may be any one material selected from copper (Cu), silver (Ag), tin (Sn), gold (Au), nickel (Ni), and palladium (Pd), and the conductive material may be filled using any one or a combination of electroless plating, electrolytic plating, screen printing, sputtering, evaporation, inkjetting and dispensing.

A first pad 160 is disposed on an uppermost insulating layer among the plurality of insulating layers (specifically, the sixth insulating layer 122 constituting the second insulating part 120), and the second pad (not shown) is disposed under a lowermost insulating layer among the plurality of insulating layers (specifically, the eighth insulating layer 132 constituting the third insulating part 130).

In other words, the first pad 160 is disposed on the uppermost insulating layer on which the electronic component 300 is to be disposed among the plurality of insulating layers. A plurality of first pads 160 may be formed on the uppermost insulating layer. In addition, a part of the first pad 160 may serve as a pattern for signal transmission, and another part may serve as an inner lead electrically connected to the electronic component 300 through a wire or the like. In other words, the first pad 160 may include a wire bonding pad for wire bonding.

In addition, the second pad (not shown) is disposed under the lowermost insulating layer to which an external substrate (not shown) is to be attached among the plurality of insulating layers. Like the first pad 160, a part of the second pad also serves as a pattern for signal transmission, and another part of the second pad serves as an outer lead on which an adhesive member (not shown) is disposed for attachment of the external substrate. In other words, the second pad may include a soldering pad for a soldering purpose.

In addition, surface treatment layers (not shown) may be disposed on the first pad 160 and under the second pad. The surface treatment layers increases the wire bonding or the soldering properties while protecting the first pad 160 and the second pad.

To this end, the surface treatment layers may be formed of a metal including gold (Au). Preferably, the surface treatment layers may include only pure gold (purity of 99% or more), and alternatively, may be formed of an alloy containing gold (Au). When the surface treatment layers are formed of an alloy containing gold, the alloy may be formed of a gold alloy containing cobalt.

A solder paste 200 is disposed on the uppermost insulating layer among the plurality of insulating layers. The solder paste is an adhesive for fixing the electronic component 300 attached to the insulating substrate 100. Accordingly, the solder paste 200 may also be referred to as an adhesive. The adhesive may be a conductive adhesive, and alternatively may be a non-conductive adhesive. That is, the circuit board 100 may be a board to which the electronic component 300 is attached by a wire bonding method, and accordingly, a terminal (not shown) of the electronic component 300 may not be disposed on the adhesive. Also, the adhesive may not be electrically connected to the electronic component 300. Accordingly, the adhesive may use a non-conductive adhesive, or alternatively, a conductive adhesive may be used.

The conductive adhesive is broadly divided into an anisotropic conductive adhesive and an isotropic conductive adhesive, and basically composed conductive particles such as Ni, Au/polymer, or Ag, and thermosetting, thermoplastic, or a blend type insulating resin that mixes the characteristics of both.

In addition, the non-conductive adhesive may be a polymer adhesive, preferably a non-conductive polymer adhesive including a thermosetting resin, a thermoplastic resin, a filler, a curing agent, and a curing accelerator.

In addition, a first protective layer SR1 exposing at least a part of the surface of the first pad 160 is disposed on the uppermost insulating layer. The first protective layer SR1 is disposed to protect the surface of the uppermost insulating layer, and for example, it may be a solder resist.

Here, the electronic component 300 may include both devices and chips. The device may be divided into an active device and a passive device, and the active device is a device that actively uses a non-linear portion, and the passive device refers to a device that does not use the non-linear characteristic even though both linear and non-linear characteristics exist. In addition, the passive device may include a transistor, an IC semiconductor chip, and the like, and the passive device may include a capacitor, a resistor, an inductor, and the like. The passive device is mounted on a general printed circuit board to increase a signal processing speed of a semiconductor chip, which is an active device, or to perform a filtering function.

Consequently, the electronic component 300 may include all of a semiconductor chip, a light emitting diode chip, and other driving chips.

A resin molding portion may be formed on the uppermost insulating layer, and accordingly, the electronic component 300 and the first pad 160 may be protected by the resin molding portion.

Meanwhile, a second protective layer SR2 is disposed under the lowermost insulating layer among the plurality of insulating layers. The second protective layer SR2 has an opening exposing the surface of the second pad. The second protective layer SR2 may be formed of a solder resist.

As described above, a buffer layer may be disposed on at least one surface of the insulating layer or the circuit pattern 140.

In detail, the buffer layer 400 may be disposed between the insulating layer and the circuit pattern 140 in a region where the insulating layer and the circuit pattern 140 overlap. Meanwhile, specifically, the buffer layer 400 may be disposed between the chemical copper plating layer, which is a seed layer for forming the circuit pattern 140, and the insulating layer. However, hereinafter, it will be described that the circuit pattern 140 includes a chemical copper plating layer.

The buffer layer 400 may be a surface treatment layer treated on the surface of the insulating layer. The buffer layer 400 may be a surface treatment layer treated on the surface of the circuit pattern 140.

The buffer layer 400 may be an intermediate layer disposed between the insulating layer and the circuit pattern. The buffer layer 400 may be a coating layer disposed between the insulating layer and the circuit pattern. The buffer layer 400 may be a functional layer that improves adhesion between the insulating layer and the circuit pattern, that is, an adhesion strengthening layer.

FIGS. 10 to 13 are views for explaining the position and arrangement relationship of the buffer layer 400. Hereinafter, a position and arrangement relationship of the buffer layer 400 disposed on the insulating layer constituting the first insulating part 110 among the plurality of insulating parts will be described. However, the buffer layer 400 may also be disposed on the insulating layer constituting the second insulating part 120 and the third insulating part 130 to correspond to the position and arrangement relationship described below.

Referring to FIG. 10, the buffer layer 400 may be disposed on the surface of the circuit pattern. For example, the buffer layer 400 may be disposed on an upper surface and a lower surface of the circuit pattern. That is, the buffer layer 400 may be disposed on a surface that contacts or faces the insulating layer among the surfaces of the circuit pattern.

Alternatively, referring to FIG. 11, the buffer layer 400 may be disposed on the surface of the circuit pattern. For example, the buffer layer 400 may be disposed on an upper surface, a lower surface, and both sides of the circuit pattern. That is, the buffer layer 400 may be disposed to surround the entire surface of the circuit pattern.

Alternatively, referring to FIG. 12, the buffer layer 400 may be disposed on the surface of the insulating layer. For example, the buffer layer 400 may be disposed on an upper surface and a lower surface of the insulating layer. That is, the buffer layer 400 may be disposed on a surface of the insulating layer that contacts or faces the circuit pattern 140. That is, the buffer layer 400 may be disposed on an entire surface of the insulating layer on which the circuit pattern 140 is disposed.

Alternatively, referring to FIG. 13, the buffer layer 400 may be disposed on the surface of the insulating layer. For example, the buffer layer 400 may be disposed on an upper surface and a lower surface of the insulating layer. That is, the buffer layer 400 may be disposed on a surface of the insulating layer that contacts or faces the circuit pattern 140. That is, the buffer layer 400 may be disposed only in a region where the circuit pattern 140 is disposed on the surface of the insulating layer on which the circuit pattern 140 is disposed.

That is, the buffer layer 400 may be disposed between the insulating layer and the circuit pattern 140. In detail, the buffer layer 400 may be disposed between the insulating layer and the circuit pattern 140, and the buffer layer 400 may be coupled to one surface of the insulating layer and one surface of the circuit pattern 140. That is, a terminal group of the buffer layer and the terminal group of the insulating layer, and the terminal group of the buffer layer and the terminal group of the circuit pattern may be chemically bonded.

The buffer layer 400 may be formed to have a constant thickness. In detail, the buffer layer 400 may be formed as a thin film. In detail, the buffer layer 400 may be formed to a thickness of 500 nm or less. In more detail, the buffer layer 400 may be formed to a thickness of 5 nm to 500 nm.

When the thickness of the buffer layer 400 is formed to be 5 nm or less, the thickness of the buffer layer is too thin to sufficiently secure adhesion between the insulating layer and the circuit pattern, and when the thickness of the buffer layer is formed to exceed 500 nm, the effect of improving adhesion according to the thickness is insignificant, an overall thickness of the circuit board may be increased, and the dielectric constant of the insulating layer may increase, so that the transmission loss of the circuit board may increase in high frequency applications.

The buffer layer 400 may include a plurality of elements. A plurality of elements included in the buffer layer 400 are combined with each other in the buffer layer and included in molecular or ionic form, and the molecules, the molecules, and the ions may be chemically bonded to each other to form a buffer layer.

The buffer layer 400 may include at least one of a carbon element, a nitrogen element, an oxygen element, a silicon element, a sulfur element, and a metal element. In detail, the buffer layer 400 may include all of a carbon element, a nitrogen element, an oxygen element, a silicon element, a sulfur element, and a metal element.

The carbon element, nitrogen element, oxygen element, silicon element, sulfur element, and metal element may be present in a molecular form by bonding to each other in the buffer layer, or may exist in an ionic form alone.

Among the plurality of elements, the oxygen element, the carbon element, and the nitrogen element may be related to a functional group of the buffer layer coupled to the insulating layer. That is, a functional group formed by molecules including the oxygen element, the carbon element, the nitrogen atom, and the like may be chemically bonded to the insulating layer.

In addition, the carbon element, the nitrogen element, the silicon element, and the sulfur element among the plurality of elements may be related to a functional group of the buffer layer coupled to the circuit pattern. That is, a functional group formed by molecules including the carbon element, the nitrogen element, the silicon element, the sulfur element, etc. may be chemically bonded to the circuit pattern.

In addition, the metal element may combine molecules formed by the carbon element, nitrogen element, oxygen element, silicon element, and sulfur element to each other. That is, molecules formed by the carbon element, nitrogen element, oxygen element, silicon element, and sulfur element may be chemically combined through the metal element to form a buffer layer. That is, the metal element may be disposed between the molecules to serve as a medium for chemically bonding the molecules.

To this end, the carbon element, nitrogen element, oxygen element, silicon element, sulfur element, and metal element may be included in a constant mass ratio. In detail, the metal element among the plurality of elements may be included the most than other elements, and the carbon element, nitrogen element, oxygen element, silicon element, and sulfur element may each be included in a constant mass ratio based on the metal element.

Specifically, the ratio of the carbon element to the metal element ((carbon element/copper element)*100) may be 5 to 7.

In addition, the ratio of the nitrogen element to the metal element ((nitrogen element/copper element)*100) may be 1.5 to 7.

In addition, the ratio of the oxygen element to the metal element ((oxygen element/copper element)*100) may be 1.1 to 1.9.

In addition, the ratio of the silicon element to the metal element ((silicon element/copper element)*100) may be 0.5 to 0.9.

In addition, the ratio of the sulfur element to the metal element ((sulfur element/copper element)*100) may be 0.5 to 1.5.

A ratio of the carbon element, nitrogen element, oxygen element, silicon element, and sulfur element to the metal element may be related to a bonding strength of the insulating layer or the circuit board.

In detail, when the ratio of the carbon element to the metal element ((carbon element/copper element)*100) is out of the range of 5 to 7, the bonding force between the buffer layer and the circuit board or the buffer layer and the insulating layer may be weakened.

In addition, when the ratio of the nitrogen element to the metal element ((nitrogen element/copper element)*100) is out of the range of 1.5 to 7, the bonding force between the buffer layer and the circuit board or the buffer layer and the insulating layer may be weakened. have.

Also, when the ratio of the oxygen element to the metal element ((oxygen element/copper element)*100) is out of the range of 1.1 to 1.9, the bonding force between the buffer layer and the insulating layer may be weakened.

In addition, when the ratio of the silicon element to the metal element ((silicon element/copper element)*100) is out of the range of 0.5 to 0.9, the bonding force between the buffer layer and the circuit board may be weakened.

In addition, when the ratio of the sulfur element to the metal element ((sulfur element sulfur/copper element)*100) is out of the range of 0.5 to 1.5, the bonding force between the buffer layer and the circuit board may be weakened.

Meanwhile, the carbon element, nitrogen element, oxygen element, silicon element, sulfur element, and metal element exist in the form of molecules or ions in the buffer layer, and the molecules and the ions may be connected to each other by bonding.

In detail, the buffer layer 400 may include molecules and metal ions formed by the carbon element, nitrogen element, oxygen element, silicon element, sulfur element, and metal elements. The molecules included in the buffer layer 400 may include at least two types of molecules depending on the size of the molecule or the size of the molecular weight. In detail, the molecule may include macromolecule and unimolecule.

The macromolecule, the unimolecule, and the metal ion may be formed in a structure in which they are bonded to each other in the buffer layer.

In detail, the macromolecule, the unimolecule, and the metal ion may be chemically bonded through covalent bonds and coordination bonds in the buffer layer to form a structure in which they are connected to each other.

The metal ion may connect the macromolecules, the unimolecules, or the macromolecule and the unimolecules to each other. In detail, the macro molecules, the unimolecules, or the macromolecule and the unimolecule are coordinate bonded with the metal ion, and accordingly, the macromolecules, the unimolecule, or the macromolecule and the unimolecule can be chemically bound.

The metal ions may include the same material as the circuit pattern. Alternatively, the metal ion may include a material different from that of the circuit pattern. For example, when the circuit pattern includes copper, the metal ions may include copper or a metal other than copper.

In detail, the metal ions may be formed by the circuit pattern. In detail, metal ions may be formed by ionizing the circuit pattern including metal using a separate oxidizing agent. Accordingly, the ionized metal ions may form a buffer layer by coordinating the macro molecules and the unimolecules in the buffer layer to connect the molecules to each other.

Alternatively, a metal ion may be separately added when the buffer layer is formed, and the metal ion may form a buffer layer by coordinating the macro molecule and the single molecule in the buffer layer to connect the molecules to each other. In this case, the separately added metal ions may be the same as or different from the metal of the circuit pattern.

The macromolecule and the unimolecule may include at least one of the carbon element, nitrogen element, oxygen element, silicon element, and sulfur element.

That is, the macromolecule and the unimolecule may be molecules including at least one of the carbon element, nitrogen element, oxygen element, silicon element, and sulfur element.

In detail, the macromolecule may include a molecule including the carbon element and the nitrogen element. In detail, the macromolecule may include an azole group including the carbon element and the nitrogen element.

In addition, the macromolecule may include a molecule including the silicon element. In detail, the macro molecule may include a silane group including the silicon element.

In addition, the unimolecule may include the carbon element, the nitrogen element, and the sulfur element. That is, the unimolecule may be a molecule including the carbon element, the nitrogen element, and the sulfur element. For example, the unimolecule may include an SCN group to which a thiocyanate group (—SCN) is connected.

Referring to FIG. 14, the buffer layer 400 may include a plurality of functional groups. In detail, the buffer layer 400 may include a first functional group chemically bonded to the insulating layer and a second functional group chemically bonded to the circuit pattern 140.

That is, the macromolecule and the unimolecules may include a plurality of terminal groups, ie, functional groups, chemically bonded to the insulating layer and the circuit pattern. The insulating layer and the circuit pattern are chemically tightly coupled by these functional groups of the buffer layer, so that adhesion between the insulating layer and the circuit pattern can be improved.

The first functional group and the second functional group may be defined as terminal groups of the buffer layer connected to one of the macromolecule, the mono atom, or the metal atom.

The first functional group may be bonded to the insulating layer by a covalent bond. The first functional group may include functional groups covalently bonded to the insulating layer. In detail, the first functional group may include a hydroxyl group (—OH) and an N group of the azole group.

In addition, the second functional group may be coupled to the circuit pattern 140 by coordination bonding. The second functional group may include functional groups coordinated with the circuit pattern 140. In detail, the second functional group may include a Si group and a thiocyanate group (—SCN) of a silane group.

The first functional group and the second functional group included in the buffer layer may be chemically bonded to the insulating layer and the circuit pattern, respectively. Accordingly, by the buffer layer disposed between the insulating layer and the circuit pattern, adhesion between the insulating layer, which is a dissimilar material, and the circuit pattern may be improved.

Meanwhile, as described above, the insulating layer constituting the second insulating part 120 and the third insulating part 130 may include a material capable of securing mechanical/chemical reliability with a low dielectric constant.

In detail, the insulating layers 121, 122, 131, and 132 may have a dielectric constant Dk of 3.0 or less. In more detail, the insulating layers 121, 122, 131, and 132 may have a dielectric constant of 2.03 to 2.7. Accordingly, the insulating layer may have a low dielectric constant, and when the insulating layer is applied to a circuit board for high frequency applications, transmission loss according to the dielectric constant of the insulating layer may be reduced.

In the lamination structure of the entire insulating layer in the first embodiment, the resin coated copper may be composed of 4 layers. For example, the circuit board in the first embodiment may include four insulating layers formed of prepreg and four insulating layers formed of resin coated copper.

For example, a number of layers of the resin coated copper in the first embodiment may satisfy a range of 30% to 50% of a total number of layers of the insulating layer.

For example, a thickness of the resin coated copper in the first embodiment may satisfy a range of 30% to 50% of a total thickness of the insulating layer.

Here, the total thickness of the insulating layer may mean a thickness of only insulating layers excluding a thickness of the circuit pattern, a thickness of the buffer layer, and a thickness of the protective layer from a total thickness of the circuit board.

In this case, the insulating layers 121, 122, 131, and 132 may have a coefficient of thermal expansion of 50 ($10^{-6}$ m/m·k) or less. Here, the insulating layers 121, 122, 131, and 132 may have a coefficient of linear thermal expansion of 50 ($10^{-6}$ m/m·k) or less, as can be seen from a unit of the coefficient of thermal expansion. In detail, the insulating layers 121, 122, 131, and 132 may have a coefficient of thermal expansion in a range of 10 to 50 ($10^{-6}$ m/m·k).

That is, the number or thickness of the insulating layers 121, 122, 131, and 132 in the first embodiment may occupy 30% to 50% of the laminated structure of the entire insulating layer, for example, the insulating layers 121, 122, 131, and 132 may be composed of four layers, and each of the resin coated copper may have a coefficient of thermal expansion in a range of 10 to 50 ($10^{-6}$ m/m·k).

In this case, the coefficient of thermal expansion of the insulating layers 121, 122, 131, and 132 can be easily adjusted by adjusting a content of the filler included in the insulating layers 121, 122, 131, and 132.

That is, the resin coated copper constituting the insulating layers 121, 122, 131, and 132 may include a filler of 55 wt % to 70 wt % to have a coefficient of thermal expansion in a range of 10 to 50 ($10^{-6}$ m/m·k).

In this case, when the coefficient of thermal expansion of the RCC constituting the insulating layers 121, 122, 131, and 132 is out of the range of 10 to 50 ($10^{-6}$ m/m·k), a problem may occur in the overall reliability of the circuit board. For example, when the coefficient of thermal expansion of the resin coated copper constituting the insulating layers 121, 122, 131, and 132 is greater than 50 ($10^{-6}$ m/m·k), a warpage may occur during the lamination process of the circuit board due to a mismatch with the coefficient of thermal expansion of the prepreg constituting the first insulating part 110.

That is, the circuit board is manufactured by sequentially laminating different kinds of insulating layers composed of prepreg and resin coated copper. In this case, the circuit board may be provided to continuous stress due to heat in the process of sequentially laminating the prepreg and the resin coated copper, a continuous stress due to heat may be transmitted to the circuit board. In addition, the degree of warpage of the circuit board increases due to the stress as described above.

Accordingly, the embodiment allows an expansion rate of the resin coated copper to correspond to an expansion rate of the prepreg in order to minimize the stress generated during the lamination process of a hybrid type circuit board composed of prepreg and resin coated copper, thereby minimizing the degree of warping of the circuit board.

The insulating layers 121, 122, 131, and 132 in the above embodiment may have a low coefficient of thermal expansion, thereby minimizing cracks in the insulating layer due to temperature change.

To this end, the insulating layers 121, 122, 131, and 132 may be formed of two materials. In detail, the insulating layers 121, 122, 131, and 132 may include a material in which two compounds are mixed. In detail, the insulating layers 121, 122, 131, and 132 may include a first compound and a second compound.

The first material and the second material may be included in a certain ratio range. In detail, the first material and the second material may be included in a ratio of 4:6 to 6:4.

In addition, the insulating layers 121, 122, 131, and 132 may further include a filler. In detail, the insulating layers 121, 122, 131, and 132 may further include the filler such as silicon dioxide ($SiO_2$). The filler may have a content of 55 wt % to 70 wt % based on a total content of the insulating layers 121, 122, 131, and 132.

When a ratio of the filler is out of the above range, the coefficient of thermal expansion or the dielectric constant may be increased by the filler, and thus properties of the insulating layer may be deteriorated, and a warpage may occur due to mismatching of the coefficient of thermal expansion with the prepreg.

In addition, the first material and the second material may be chemically non-bonded with each other in the insulating layers 121, 122, 131 and 132. However, embodiments are not limited thereto, and the first material including the first compound and the second material including the second compound may be directly chemically bonded or chemically bonded by a separate linking group.

The first material may include a material having an insulating property. In addition, the first material may have improved mechanical properties due to high impact strength. In detail, the first material may include a resin material. For example, the first material may include a first compound including polyphenyl ether (PPE).

The first material may include a plurality of the first compounds, and the first compounds may be formed by chemically bonding with each other. In detail, the first compound may be linearly connected to each other by a covalent bond, that is, a pi-pi bond ($\pi$-$\pi$).

That is, the first compounds may be formed by chemically bonding with each other so that the first material has a molecular weight of about 300 to 500.

In addition, the second material may include a second compound. In detail, the second material may be formed by chemically bonding a plurality of second compounds to each other.

The second compound may include a material having a low dielectric constant and a coefficient of thermal expansion. In addition, the second compound may include a material having improved mechanical strength.

The second compound may include tricyclodecane and a terminal group connected to the tricyclodecane. The terminal group connected to the tricyclodecane may include various materials in which the second compounds may be connected to each other by a carbon double bond (C=C bonding). In detail, the terminal group connected to the tricyclodecane may include an acrylate group, an epoxide group, a carboxyl group, a hydroxyl group, and an isocyanate group.

The second compounds may be linked to each other between the terminal groups connected to the tricyclodecane. Specifically, the second compounds are cross-linked between the terminal groups by a carbon double bond (C=C bonding) to form a network structure.

Specifically, referring to FIG. 15, the second compounds may be cross-linked to form a network structure. That is, the second compounds may be an aggregate of bonds having a plurality of network structures.

Accordingly, the second material formed by the second compounds may have a low dielectric constant and a low coefficient of thermal expansion according to material properties, and may have improved mechanical strength due to the network structure.

FIG. 16 is a view showing an arrangement structure of a first material and a second material included in an insulating layer of a printed circuit board according to an embodiment.

The first material and the second material may be formed as one single phase in the insulating layer. Referring to FIG. 16, the first material connected by the covalent bond of the first compound may be disposed inside the second material formed by the second compound cross-linked to each other to form a network structure.

In detail, the first compound may be disposed inside the network structure of the second material formed by chemically bonding the second compound to prevent the first material from being separated from the second material.

That is, the first material and the second material are not disposed to be phase-separated in the insulating layer, and may be formed in a one single-phase structure. Accordingly, it may be formed in one single phase while having a low dielectric constant and a low coefficient of thermal expansion due to the material properties of the first material and the second material, and thus have high mechanical strength.

Meanwhile, in the first embodiment, the first insulating part 110 has an insulating layer made of PPG containing glass fibers, and the second insulating part 120 and the third insulating part 130 are composed of resin coated copper with a low dielectric constant and a low coefficient of thermal expansion.

As described above, in the first embodiment, the coefficient of thermal expansion of each insulating layer constituting the second insulating part 120 and the third insulating part 130 is in the range of 10 to 50 ($10^{-6}$ μm/m·k). To this end, each insulating layer constituting the second insulating part 120 and the third insulating part 130 in the first embodiment is composed of resin coated copper, and this may include a filler of 55 wt % to 70 wt %.

As described above, the first embodiment allows the resin coated copper constituting the second insulating part 120 and the third insulating part 130 to be made of a total of four layers, and accordingly, the coefficient of thermal expansion of the resin coated copper satisfies the first range.

In this case, the coefficient of thermal expansion of the resin coated copper may have a second range smaller than the first range and a third range larger than the first range, depending on the number of layers. That is, when the number of layers increases (five or more), the coefficient of thermal expansion of the resin coated copper may have a second range smaller than the first range. In addition, when the number of layers is reduced (three or less), the coefficient of thermal expansion of the resin coated copper may have a third range greater than the first range.

On the other hand, the embodiment allows the second insulating part 120 and the third insulating part 130 to be made of resin coated copper, and accordingly, the thickness of each insulating layer constituting the second insulating part 120 and the third insulating part 130 may be reduced.

FIG. 17 is a cross-sectional view of a printed circuit board according to a second embodiment.

Referring to FIG. 17, the printed circuit board 1000A may include an insulating substrate including first to third insulating parts, a first pad 160, a first protective layer SR1, a second protective layer SR2, a solder paste 200, and the electronic component 300.

The insulating substrate may be composed of an insulating part including a plurality of insulating layers.

As described in FIG. 9, the insulating part includes a first insulating part 110 made of prepreg, a second insulating part 120A disposed on the first insulating part 110 and made of resin coated copper, and a third insulating part 130A disposed under the first insulating part 110 and made of resin coated copper.

In this case, the second embodiment allows the second insulating part 120A and the third insulating part 130A to be made of resin coated copper, and accordingly, the thickness of each insulating layer constituting the second insulating part 120A and the third insulating part 130A may be reduced.

Accordingly, a thickness H2 of each insulating layer constituting the second insulating part 120A and the third insulating part 130A in the second embodiment may be smaller than a thickness H1 of the circuit pattern 140.

For example, the thickness H1 of the circuit pattern 140 may be 12 µm±2 µm. That is, the thickness H1 of the circuit pattern 140 may range from 10 µm to 14 µm.

In addition, the thickness H2 of each insulating layer constituting the second insulating part 120A and the third insulating part 130A may have a thickness of 8 µm±2 µm. That is, the thickness of each insulating layer constituting the second insulating part 120A and the third insulating part 130A may range from 6 µm to 10 µm. In this case, the thickness H2 of each insulating layer constituting the second insulating may be defined as a height of a portion protruding from an upper surface of the circuit pattern 140.

Accordingly, a thickness of the via 150 disposed in each insulating layer constituting the second insulating part 120A and the third insulating part 130A may be smaller than the thickness of the circuit pattern 140.

Meanwhile, the first and second embodiments allow the resin coated copper to occupy 30% to 50% of the thickness or number of layers in an entire stacked structure of the insulating layer. Alternatively, the number of layers or thickness occupied by the resin coated copper may be increased or decreased.

The characteristics, structures, effects, and the like described in the above-described embodiments are included in at least one embodiment, but are not limited to only one embodiment. Furthermore, the characteristic, structure, and effect illustrated in each embodiment may be combined or modified for other embodiments by a person skilled in the art. Therefore, it should be construed that contents related to such combination and modification are included in the scope of the embodiment.

Embodiments are mostly described above, but the embodiments are merely examples and do not limit the embodiments, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the embodiment defined in the following claims.

What is claimed is:

1. A resin coated copper comprising
an insulating layer including a resin and a filler dispersed in the resin; and
a copper foil layer disposed entirely on the insulating layer,
wherein the copper foil layer includes a protrusion formed corresponding to a copper particle of the copper foil layer,
wherein the insulating layer has a plurality of recesses formed on a surface in contact with the copper foil layer and having a width corresponding to a diameter of the protrusion of the copper foil layer,
and
wherein the plurality of recesses have a width of 200 nm to 350 nm.

2. The resin coated copper of claim 1, wherein a range of the diameter of the protrusion corresponding to the copper particle is the same as the range of the width of the plurality of recesses,
wherein the protrusion have a diameter of 200 nm to 350 nm, and
wherein the recess is a recess formed on the surface of the insulating layer to correspond to the protrusion.

3. The resin coated copper of claim 1, wherein the insulating layer has 30 to 50 recesses within a virtual line having a length of 10 µm on the surface.

4. The resin coated copper of claim 1, wherein the insulating layer has a center line average surface roughness (Ra) of 0.1 µm to 0.15 µm.

5. The resin coated copper of claim 1, wherein the insulating layer has a ten-point average surface roughness (Rz) of 0.8 µm to 1.5 µm.

6. The resin coated copper of claim 1, wherein the diameter of the protrusion is same as the width of the recess.

7. A printed circuit board comprising:
a first insulating layer comprising a first insulating material;
a second insulating layer disposed on the first insulating layer and including a second insulating material different from the first insulating material;
a first circuit pattern disposed on the second insulating layer;
a third insulating layer disposed under the first insulating layer and including the second insulating material; and
a second circuit pattern disposed under the third insulating layer;
wherein the second insulating layer includes a plurality of first recesses provided entirely on an upper surface of the second insulating layer and having a width of 200 nm to 350 nm, and
wherein the third insulating layer includes a plurality of second recesses provided entirely on a lower surface of the third insulating layer and having a width of 200 nm to 350 nm.

8. The printed circuit board of claim 7, wherein each of the second and third insulating layers has a center line average surface roughness (Ra) of 0.1 µm to 0.15 µm and a ten-point average surface roughness (Rz) of 0.8 µm to 1.5 µm.

9. The printed circuit board of claim 7, wherein the plurality of first recesses of the second insulating layer include:
a first-first recess contacting the first circuit pattern; and
a first-second recess not contacting the first circuit pattern.

10. The printed circuit board of claim 9, wherein the second insulating layer includes:
a second-first insulating layer disposed on the first insulating layer; and
a second-second insulating layer disposed on the second-first insulating layer, and
wherein a first-second recess of the second-first insulating layer contacts the second-second insulating layer.

11. The printed circuit board of claim 7, wherein the plurality of second recesses of the third insulating layer include:
- a second-first recess contacting the second circuit pattern; and
- a second-second recess not contacting the second circuit pattern.

12. The printed circuit board of claim 11, wherein the third insulating layer includes:
- a third-first insulating layer disposed under the first insulating layer;
- a third-second insulating layer disposed under the third-first insulating layer, and
- wherein a second-second recess of the third-first insulating layer contacts the third-second insulating layer.

13. The printed circuit board of claim 7, wherein the first insulating layer includes a prepreg containing glass fibers,
- wherein the second and third insulating layers include a resin coated copper (RCC),
- wherein each of the first to third insulating layers has a coefficient of thermal expansion corresponding to each other in a range of 10 to 50 (10-6 m/m·k).

14. The printed circuit board of claim 13, wherein at least one of the first to third insulating layers is provided with a plurality of layers, and wherein a number of layers of the second and third insulating layers ranges from 30% to 50% of a total number of layers of the first to third insulating layers.

15. The printed circuit board of claim 13, wherein a sum of a thicknesses of each of the second and third insulating layers has a range of 30% to 50% of a total thickness of the first to third insulating layers.

16. The printed circuit board of claim 13, wherein each of the RCC of the second and third insulating layers includes a filler in a content of 55 wt % to 70 wt % and has a dielectric constant in a range of 2.03 to 2.7,
- wherein each of the RCC includes a first compound including polyphenyl ether (PPE); and a second compound including tricyclodecane and a terminal group connected to the tricyclodecane,
- wherein a weight ratio of the first compound to the second compound is 4:6 to 6:4,
- wherein the terminal group includes at least one of an acrylate group, an epoxide group, a carboxyl group, a hydroxyl group, and an isocyanate group, and
- wherein the first compound and the second compound are not chemically bound.

* * * * *